US012665011B2

(12) United States Patent
Schmidt et al.

(10) Patent No.: US 12,665,011 B2
(45) Date of Patent: Jun. 23, 2026

(54) MEMRISTIVE STRUCTURE AND MEMRISTIVE DEVICE

(71) Applicant: TechIFab GmbH, Radeberg (DE)

(72) Inventors: Heidemarie Schmidt, Dresden (DE); Nan Du, Jena (DE); Ilona Skorupa, Dresden (DE)

(73) Assignee: TechIFab GmbH, Radenberg (DE)

( * ) Notice: Subject to any disclaimer, the term of this patent is extended or adjusted under 35 U.S.C. 154(b) by 208 days.

(21) Appl. No.: 18/348,394

(22) Filed: Jul. 7, 2023

(65) Prior Publication Data

US 2024/0013830 A1 Jan. 11, 2024

(30) Foreign Application Priority Data

Jul. 7, 2022 (DE) ..................... 10 2022 116 981.2

(51) Int. Cl.
| | |
|---|---|
| *G11C 11/22* | (2006.01) |
| *H10B 53/30* | (2023.01) |
| *H10N 70/00* | (2023.01) |
| *H10N 70/20* | (2023.01) |

(52) U.S. Cl.
CPC ...... *G11C 11/2275* (2013.01); *G11C 11/2273* (2013.01); *H10B 53/30* (2023.02); *H10N 70/20* (2023.02); *H10N 70/841* (2023.02)

(58) Field of Classification Search
CPC ............ G11C 11/2275; G11C 11/2273; G11C 11/221; G11C 13/004; G11C 13/0069; G11C 13/0007; H10B 53/30; H10N 70/20; H10N 70/841; H10N 70/826; H10N 70/8836; H10D 1/682
See application file for complete search history.

(56) References Cited

U.S. PATENT DOCUMENTS

| | | | |
|---|---|---|---|
| 11,374,163 B2 | 6/2022 | Gosavi et al. | |
| 2015/0358151 A1 | 12/2015 | You et al. | |
| 2020/0321344 A1 | 10/2020 | Ramamoorthy et al. | |
| 2022/0059161 A1 | 2/2022 | Demasius et al. | |
| 2022/0172791 A1* | 6/2022 | Schenk .................. | G11C 16/04 |

(Continued)

FOREIGN PATENT DOCUMENTS

| | | |
|---|---|---|
| CN | 111640865 A | 9/2020 |
| DE | 102013200615 A1 | 7/2014 |
| EP | 3826079 A1 | 5/2021 |

OTHER PUBLICATIONS

Augusto Román et al., BaTIO 3 thin films on platinized silicon: Growth, characterization and resistive memory behavior, Thin Solid Films, vol. 628, pp. 208-213, Elsevier, Mar. 18, 2017.

(Continued)

*Primary Examiner* — Jerome Leboeuf
(74) *Attorney, Agent, or Firm* — Natalie Albrecht

(57) ABSTRACT

According to various aspects, a memristive structure is provided including: a first electrode, a second electrode, and a memristive element arranged between the first electrode and the second electrode; wherein the memristive element includes a memristive material that has a ferroelectric polarization capability, and wherein the memristive material has a crystalline microstructure configured to suppress a substantial ferroelectric switching of the memristive element in response to a voltage drop over the memristive element applied via the first electrode and the second electrode.

18 Claims, 13 Drawing Sheets

(56)                    References Cited

U.S. PATENT DOCUMENTS

| | | | | |
|---|---|---|---|---|
| 2022/0189546 A1* | 6/2022 | Gong | ................... | G11C 11/223 |
| 2025/0069658 A1* | 2/2025 | Syed | ................ | G11C 13/0004 |

OTHER PUBLICATIONS

C.-H. Yang et al., Electric modulation of conduction in multiferroic Ca-doped BiFeO3 films, Nature Materials, vol. 8, No. 6, Apr. 26, 2009.

Extended European search report issued for the corresponding European patent application No. 23183823.6, dated Nov. 16, 2023, 3 pages (for informational purposes only).

German Search Report issued for the corresponding DE patent application No. 10 2022 116 981.2, dated Feb. 14, 2023, 8 pages (For informational purposes only).

\* cited by examiner

130

230

230

105

103

130

230

230

105

103

130

230

230

105

103

$V_{ini} = -|V_{max}|$ (HRS)

$V_{ini} = +|V_{max}|$ (LRS)

300a $V_{ini}=-|V_{max}|$ (HRS)

$S_{FE}$    Current

2

1

Voltage

3

$S_{FE}$

4

300b $V_{ini}=+|V_{max}|$ (LRS)

$S_{FE}$    Current

4

3

1

Voltage $S_{FE}$

2

300a $V_{ini}=-|V_{max}|$ (HRS)

$S_{FE}$    Current

2

1

Voltage

3

$S_{FE}$

4

300b $V_{ini}=+|V_{max}|$ (LRS)

$S_{FE}$    Current

4

3

Voltage

1

$S_{FE}$

2

300a

Electric Field $S_{FE}$

4

4

1

2

1

Polarization

Current

3

2

$S_{FE}$

3

Voltage

300b

Electric Field $S_{FE}$

2

2

3

4

3

Polarization

Current

1

4

$S_{FE}$

1

Voltage

MEMRISTIVE STRUCTURE AND MEMRISTIVE DEVICE

CROSS-REFERENCE TO RELATED APPLICATION(S)

This application claims priority to German Patent Application No. 10 2022 116 981.2 filed on Jul. 7, 2022, the contents of which are fully incorporated herein by reference.

TECHNICAL FIELD

Various aspects relate to a memristive structure and a memristive device.

BACKGROUND

In general, various data processing applications may rely on transistor technologies. However, it was found that resistor arrays may be useful for some data processing applications as well. Such resistor-based technologies were further developed to allow for a selective reconfiguration of an electric resistance of resistors. Such devices having a non-volatile, reconfigurable electric resistance may be referred to as memristive devices or memristors, for example. Memristor crossbar arrays were developed to replace transistors and memory cells in some data processing and data storage applications. However, an occurrence of leakage currents in memristor based crossbar arrays may limit a scalability of such structures. Therefore, several types of memristors with nonlinear resistance behavior have been proposed to reduce leakage currents when reconfiguring and reading selective memristors over nonselective memristors. These include so-called complementary resistance switches, which include two memristive structures connected in series, wherein a disadvantage of this technology may be that the state of the complementary resistance can be only read out destructively and, therefore, the complementary resistance switch has to be rewritten after readout. An approach for a nondestructive readout of a state of a complementary resistive switch may be based on capacitance measurements. A complementary resistive switch may include a two-layer memristive structure with strong nonlinear resistive behavior and a single-layer memristive structure with strong nonlinear resistive behavior.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 9 schematically shows a memristive device, according to various aspects; and FIG. 10A through FIG. 10D show aspects of electric characteristics corresponding to barrier switching of a memristive element with a superimposed ferroelectric switching of the memristive element.

DESCRIPTION

Figure 1A:
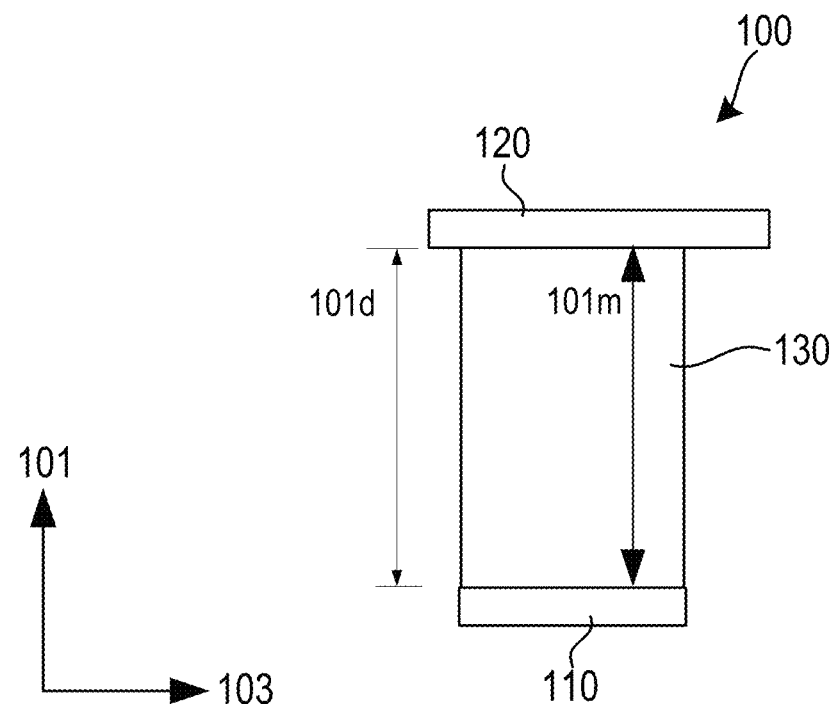
FIG. 1A and FIG. 1B schematically show various aspects of a memristive structure.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., arrangements). However, it may be understood that aspects described in connection with methods may similarly apply to the devices, and vice versa.

The terms "at least one" and "one or more" may be understood to include any integer number greater than or equal to one, i.e., one, two, three, four, [ . . . ], etc. The term "a plurality" may be understood to include any integer number greater than or equal to two, i.e., two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "coupled" may be used herein with respect to nodes, circuit elements, and the like, to mean a, e.g. direct or indirect, connection and/or interaction. Several elements may, for example, be coupled together along an interaction chain (e.g., an electrically conductive path), along which the interaction (e.g., electrical charges) may be transmitted. For example, two elements coupled together may interact with each other.

In some aspects, two physical and/or chemical properties (e.g., an electrical voltage, an electrical current, an electrical conductance, a thickness, an electrical conductivity, a doping concentration, as examples) may be compared with one another by relative terms such as "greater", "higher", "lower", "less", or "equal", for example. It is understood that, in some aspects, a comparison may include a sign (positive or negative) of a value representing the physical and/or chemical properties or, in other aspects, the absolute values are considered for the comparison. However, a comparison of measurement values representing a physical and/or chemical property may usually include a measurement of such measurement values by the same measurement principle or at least by comparable measurement principles.

Various aspects are related to specific configurations of a memristive element that shows a desired memristive switching behavior (e.g., a configurable barrier height switching behavior), wherein the memristive element includes a ferroelectric material. The ferroelectric material may be in some aspects an undesired material that is included in the memristive element as an impurity in addition to a memristive material; or, in other aspects, a memristive material of the memristive element may have inherent ferroelectric properties. In the case that a ferroelectric material is included in a memristive element, the memristive element may, in some aspects, show a ferroelectric switching behavior that is superimposed to the memristive switching behavior. Such a superposition of two switching effects may lead in some aspects to problems during operating the memristive element in its memristive function. Therefore, according to various aspects, various configurations of a memristive element are described herein that avoid a substantial ferroelectric switching of such a memristive element that includes a ferroelectric material.

According to some aspects, a memristive structure may include a first electrode, a second electrode, and a memristive element disposed between the first electrode and the second electrode. The memristive element may include a memristive material that has a (e.g., inherent) ferroelectric polarization capability, and the memristive material may have a crystalline microstructure configured to suppress a substantial ferroelectric switching of the memristive element in response to a voltage drop over the memristive element applied via the first electrode and the second electrode.

According to other aspects, a memristive structure may include a first electrode, a second electrode, and a memristive element disposed between the first electrode and the second electrode. The memristive element may include a memristive material and a ferroelectric material, wherein the ferroelectric material may have a crystalline microstructure configured to suppress a substantial ferroelectric switching of the memristive element in response to a voltage drop over the memristive element applied via the first electrode and the second electrode.

A suppression of a substantial ferroelectric switching in a memristive element allow for an memristive operation of the memristive element even if a ferroelectric material is involved that is prone to cause a ferroelectric switching disturbance during the memristive operation of the memristive element.

According to various aspects, a crystalline microstructure of the material included in the memristive element is controlled during fabrication of the memristive element and, as a result, a desired crystalline microstructure can be caused to suppress a substantial ferroelectric switching of the memristive element in response to a voltage drop over the memristive element applied via the first electrode and the second electrode.

It was found that, in some aspects, the crystalline microstructure can be a poly-crystalline microstructure with a specific average crystallite size (e.g., height, diameter, and/or width) to suppress a substantial ferroelectric switching of the memristive element. It was found that, in some aspects, a thickness of the memristive element may be greater than twice the average crystallite height to suppress a substantial ferroelectric switching of the memristive element. It was found that, in general, a comparatively small crystallite size (e.g., relative to the dimension of the memristive element) may allow for a spatial arrangement of crystallites (e.g., spatial distribution and/or orientation) in a layer portion (e.g., the active layer portion of the memristive element that includes the functional memristive material) that allows for a suppression of a substantial ferroelectric switching of the memristive element.

As an example, in the case that a spatial orientation of crystallites of a poly-crystalline memristive material (or of a ferroelectric material) is randomly distributed (e.g., at least with respect to a direction of an electric switching field caused by electrodes neighboring the memristive element), a polarization current (e.g., caused by applying a ramp voltage scheme to electrodes in contact with the memristive element) may be reduced, since current contributions associated with a polarization switching of oppositely oriented crystallites compensate each other at least partially. Consequently, when a random spatial orientation distribution of crystallites is present, a larger number of crystallites may lead to a more efficient reduction of an undesired polarization current effect during operating the memristive element.

As an example, in the case that a spatial orientation distribution of one or more crystallites with ferroelectric properties is provided such that a main polarization direction of the one or more crystallites is oriented substantially perpendicular to a direction of an electric switching field caused by electrodes neighboring the memristive element. In such a configuration, a polarization current (e.g., caused by applying a ramp voltage scheme to electrodes in contact with the memristive element) may be reduced, since the polarization direction of one or more crystallites is not switched by the electric switching field since the electric switching field is substantially perpendicular to the main polarization direction of the one or more crystallites.

According to various aspects, it was found that a coercive voltage associated with a polarization switching of the memristive element can be modified by controlling the crystalline microstructure of the memristive material and/or the ferroelectric material of the memristive element such that the coercive voltage is outside a write voltage range (e.g., below or above the write voltage range) associated with a memristive switching of the memristive element. This configuration may allow for operating the memristive element in the write voltage range without causing the polarization switching or without influencing the memristive characteristics (e.g., the read/write characteristics) by the polarization switching.

According to various aspects, a memristive device may include a memristive structure. The memristive structure may include a first electrode, a second electrode, and a memristive element disposed between the first electrode and the second electrode. The memristive element may include a memristive material that has a barrier switching capability and a ferroelectric switching capability, and the memristive element may be configured to substantially suppress a ferroelectric switching of the memristive element in response to a voltage drop over the memristive element applied via the first electrode and the second electrode that causes a barrier switching of the memristive element. The memristive device may further include at least one control circuit to control a read operation of the memristive element. The control circuit may be configured to read out the memristive element via a read voltage in a read voltage range and/or to write the memristive element via a write voltage in a write voltage range. The write voltage range may be distinct from the read voltage range. A coercive voltage associated with the ferroelectric switching may be outside the read voltage range and/or outside the write voltage range.

Figure 1B:
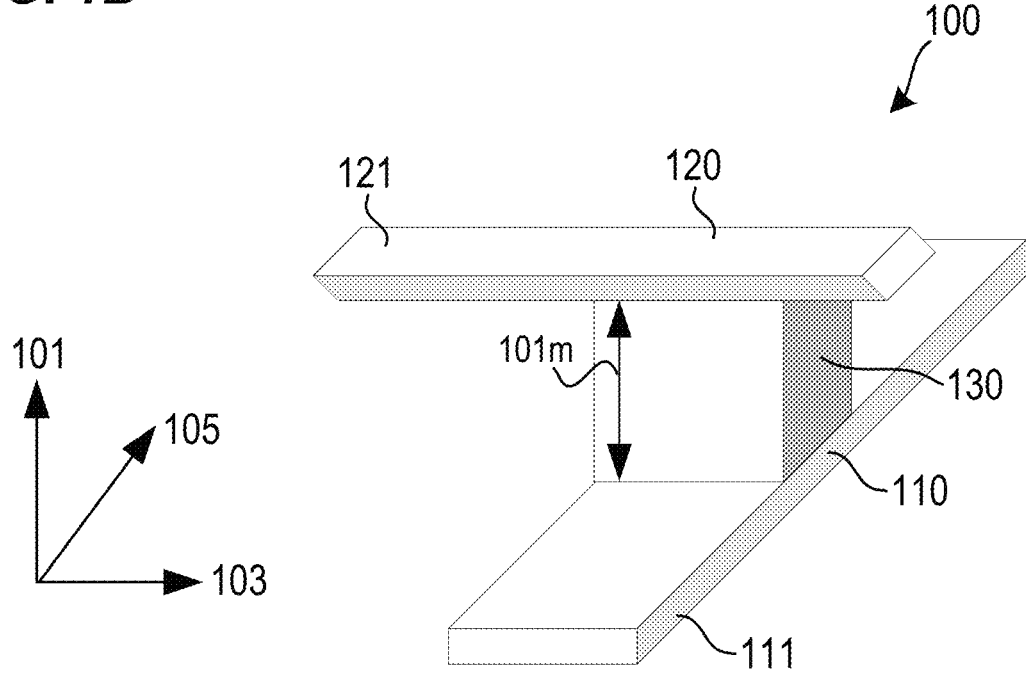
Figures 2A, 2B:
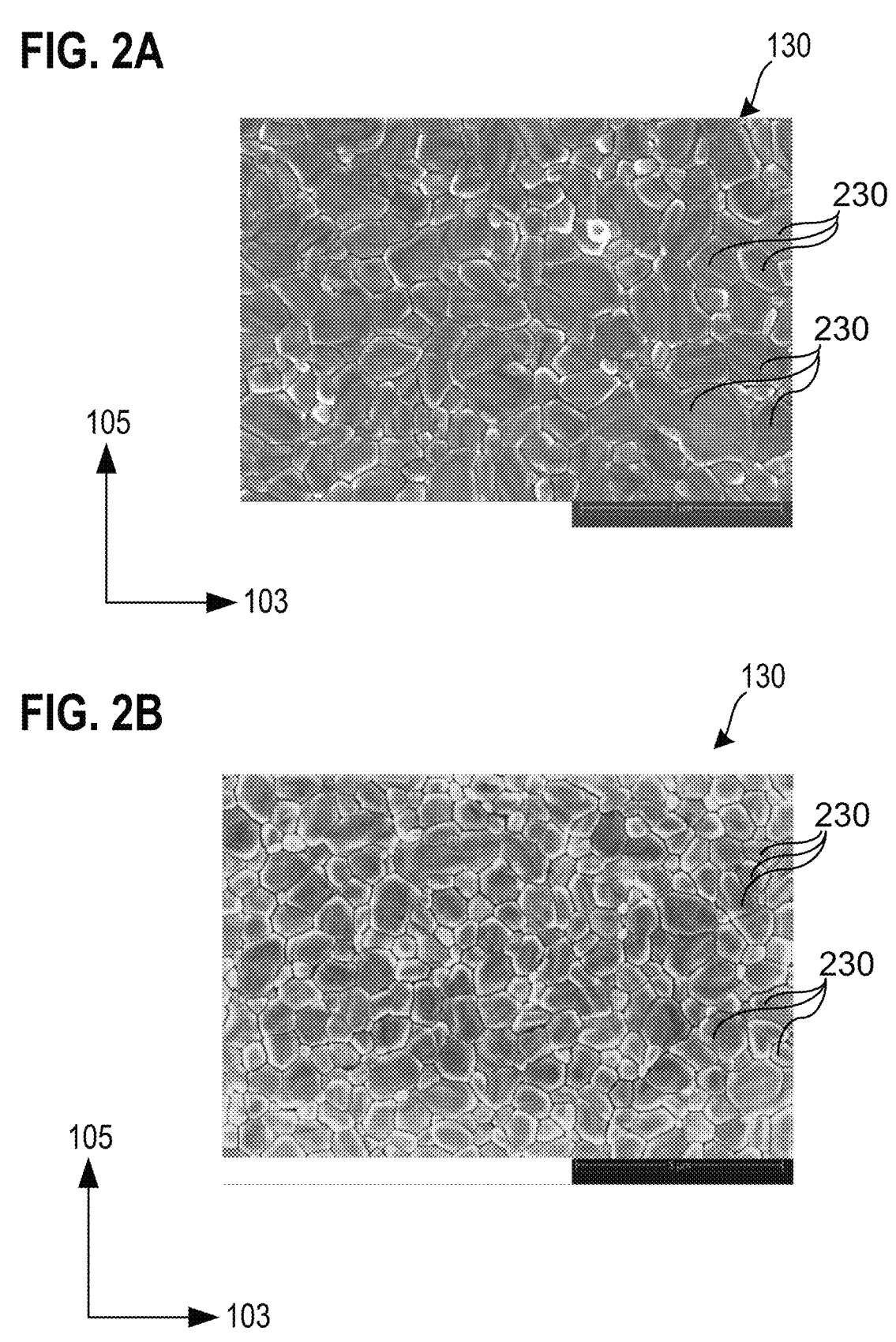
FIG. 2A through FIG. 2E show exemplary scanning electron microscopy images of a memristive element of a memristive structure, according to various aspects.
Figure 2C:
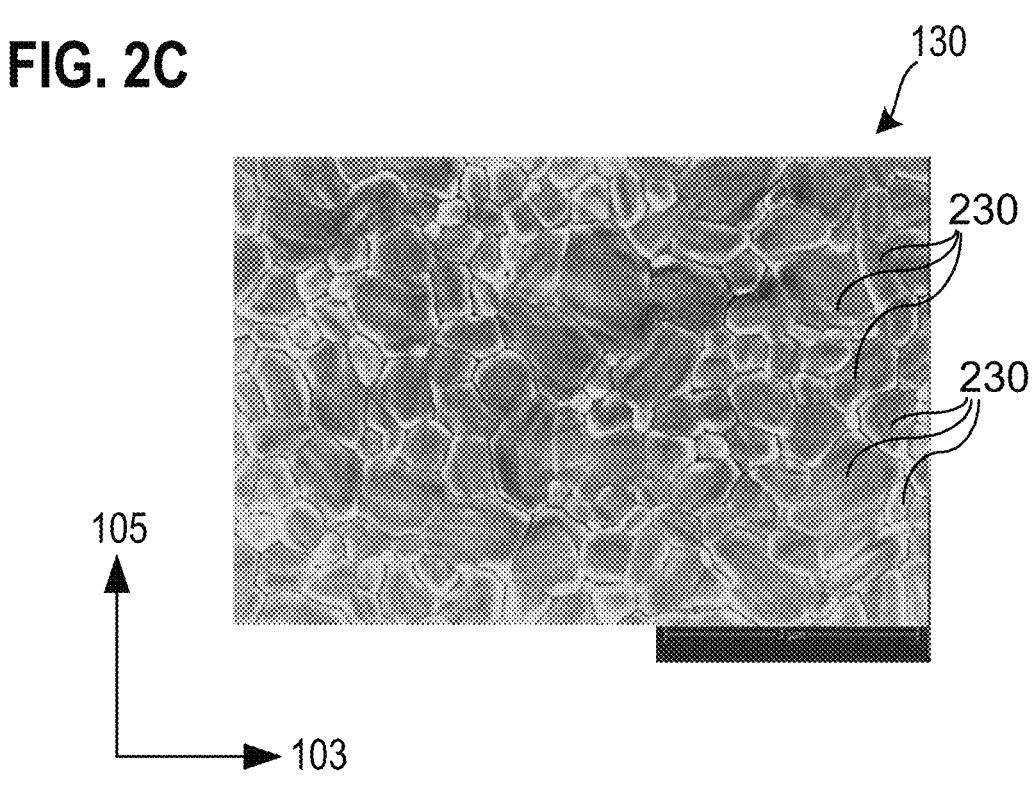
Figure 2D:
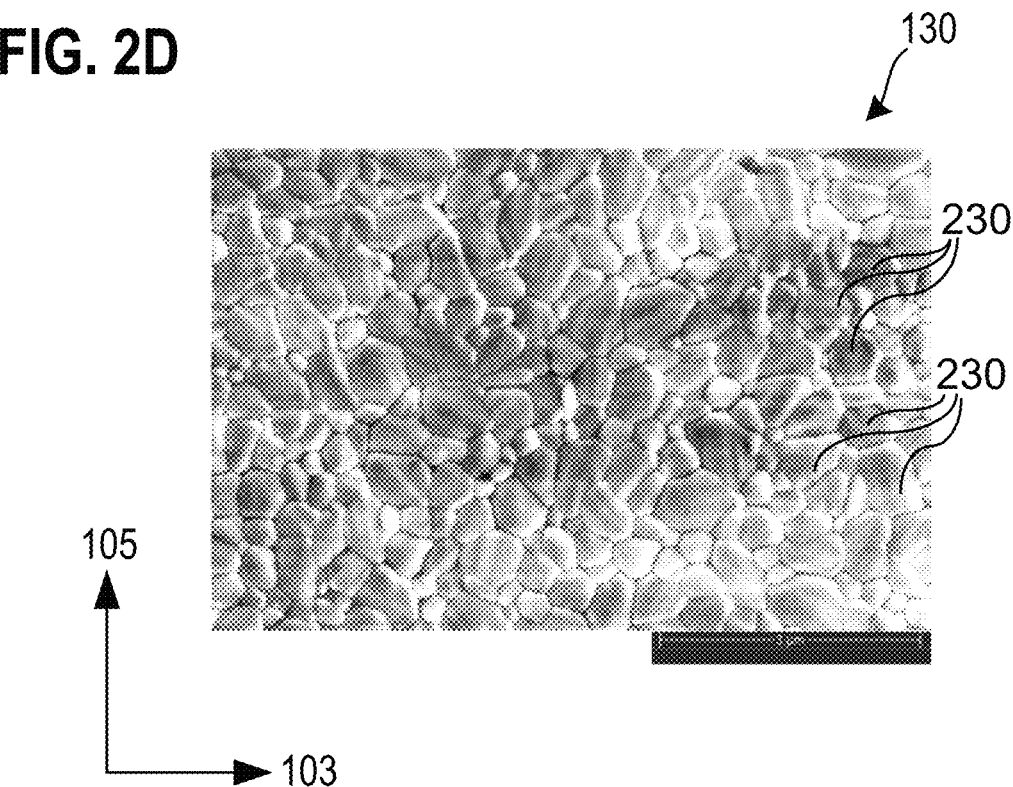
Figure 2E:
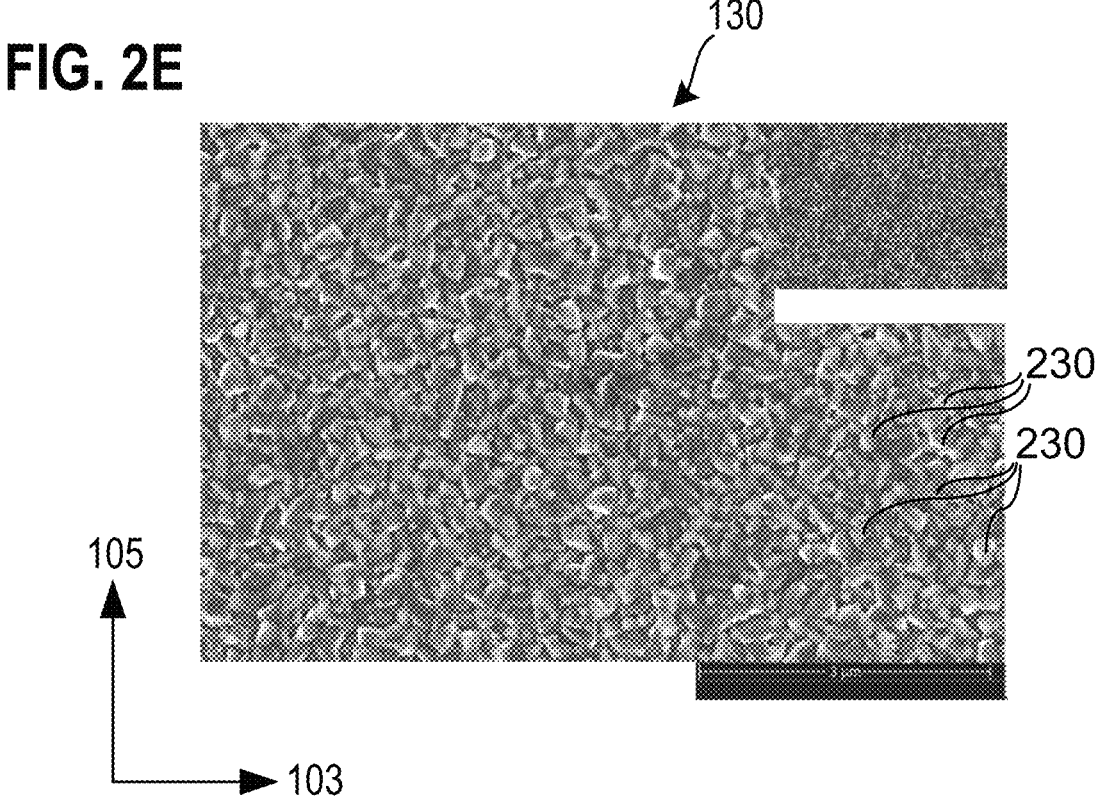

FIG. 1A and FIG. 1B show various schematic views of a memristive structure 100 according to various aspects. The memristive structure 100 may be, for example, part of a memristive device that may include one or more memristive structures 100 and a controller to operate the one or more memristive structures 100.

The memristive structure 100 may include a first electrode 110 and a second electrode 120. The first electrode 110 and/or the second electrode 120 may include (e.g., may consist of) any suitable electrically conductive material, e.g., Al, Cu, Ti, AlCu, TiN, W, Ta, only as examples. As illustrated in FIG. 1A and FIG. 1B, the memristive structure 100 may include at least two electrodes 110, 120 in a capacitor-like arrangement which allows for a generation of an electric field in a space between the at least two electrodes 110, 120. The configuration of the at least two electrodes 110, 120 may define the direction of the electric field and therefore may influence polarization effects of a material that is disposed between the at least two electrodes 110, 120. In some configurations, the at least two electrodes 110, 120 may have a planar shape (e.g., in the plane 103/105) and the electric field may be directed perpendicular to the planar shaped electrodes (e.g., parallel to direction 101 that is perpendicular to directions 103 and 105 that define the plane 103/105). However, other configurations (e.g., angled or curved electrodes) can be used as well. In some aspects, the at least two electrodes 110, 120 may be configured as portions of control lines 111/121 (e.g., in the case that the memristive structure 100 is part of a crossbar array). However, memristive structures 100 may be arranged in any suitable type of array with suitable control lines.

The memristive structure 100 may further include a memristive element 130. The memristive element 130 may be disposed between the first electrode 110 and the second electrode 120. Illustratively, the region in which the first electrode 110 and the second electrode 120 overlap one another may be (e.g., partially or completely) filled with memristive material 101m. According to various aspects, the memristive element 130 (e.g., the memristive material of the memristive element 130) may be in electrical contact with the at least two electrodes 110, 120. According to various aspects, the memristive element 130 (e.g., the memristive material of the memristive element 130) may be in direct physical contact with both the first electrode 110 and the second electrode 120. Therefore, according to various aspects, a dimension 101d (e.g., a height or a thickness) of the memristive element 130 may be defined by a distance from the first electrode 110 to the second electrode 120. The distance from the first electrode 110 to the second electrode 120 may be understood as a shortest distance measure, for example, perpendicular to planes in which the electrodes are formed. According to various aspects, the dimension 101d (e.g., the height) of the memristive element 130 may be in a predefined range.

According to various aspects, a voltage drop (for example a ramp voltage drop) over the memristive element 130 may be caused by applying voltages to the first electrode 110 and/or the second electrode 120. The voltage drop may be used to cause specific functions, e.g., to write the memristive element 130 (e.g., in terms of barrier height switching), to read the memristive element 130, and/or to reset the memristive element 130, as examples. However, the voltage drop may also generate an electric field (e.g., a switching field)

which could change a polarization of a ferroelectric material (e.g., which could switch ferroelectric crystallites from a positive polarization to a negative polarization or vice versa) included in the memristive element 130. Therefore, according to various aspects, the memristive element 130 may be configured to suppress a change of the polarization of the ferroelectric material included in the memristive element 130 even if a respective voltage drop over the memristive element 130 is caused.

According to various aspects, the memristive element 130 may include a material that has a ferroelectric (e.g., remanent polarizable) polarization capability. In some aspects, the memristive element 130 may include a memristive material (e.g., $BiFe_xO_y$) that has an inherent ferroelectric polarization capability; or, in other aspects, the memristive element 130 may include a memristive material that has no inherent ferroelectric but the memristive element 130 includes additionally a ferroelectric material.

According to various aspects, the memristive material and/or the ferroelectric material may have a crystalline microstructure configured to suppress a substantial ferroelectric switching of the memristive element in response to a voltage drop over the memristive element applied via the first electrode 110 and the second electrode 120. The crystalline microstructure may be a polycrystalline microstructure or a monocrystalline microstructure. Potential influence of the crystalline microstructure on the memristive operation characteristics are described in more detail below.

The crystalline microstructure may be analyzed volume based, for example, using X-Ray analysis. In some aspects, the crystalline microstructure may be analyzed cross-section based, for example, using TEM (transmission electron microscopy) or cross-sectional SEM (scanning electron microscopy). The crystalline microstructure may be controlled (e.g., in terms of size and shape of the crystallites, the number of crystallites, the spatial orientation of the crystallites, only as example) during fabrication of the memristive element 130.

According to various aspects, a memristive element 130 may be regarded to include a poly-crystalline material in the case that two or more (e.g., ten or more) crystallites are disposed in the effective memristive area between the first electrode 110 and the second electrode 120. According to various aspects, a memristive element 130 may be regarded to include a single-crystalline material in the case that only one crystallite is disposed in the effective memristive area between the first electrode 110 and the second electrode 120. Material properties of the memristive element 130 outside the effective memristive area (e.g., outside a region where the first electrode 110 and the second electrode 120 overlap one another) may be not crucial for the functioning of the memristive structure 100.

In the case that the crystalline microstructure of the memristive element 130 is poly-crystalline, the memristive element 130 may include one or more crystallites that have an average crystallite size (e.g., an average crystallite height measured in direction 101 and/or an average crystallite width measured perpendicular to direction 101, e.g., in the plane 103/105). The term average in this context may include an arithmetic mean over the crystallite height and/or width of all crystallites of the memristive element 130 (e.g., of all crystallites located in an effective memristive area between the at least two electrodes 110, 120). The crystallite height may be defined as a maximal dimension of a crystallite in height direction (e.g., parallel to direction 101, e.g., substantially perpendicular to a surface of the first electrode 110 facing the memristive element 130 and/or perpendicular to a surface of the second electrode 120 facing the memristive element 130. The crystallite height may be defined as a maximal dimension of a crystallite in a direction substantially parallel to an electric field caused by the first electrode 110 and second electrode 120 upon applying a voltage between the first electrode 110 and the second electrode 120. The crystallite width may be defined as a maximal dimension of a crystallite in width direction (e.g., parallel to direction 103 and/or direction 105, e.g., substantially parallel to a surface of the first electrode 110 facing the memristive element 130 and/or perpendicular to a surface of the second electrode 120 facing the memristive element 130. The crystallite width may be defined as a maximal dimension of a crystallite in a direction substantially perpendicular to an electric field caused by the first electrode 110 and second electrode 120 upon applying a voltage between the first electrode 110 and the second electrode 120.

If the crystalline microstructure of one or more materials that form the memristive element 130 is a polycrystalline microstructure, the crystalline microstructure is characterized by a plurality of crystallites 230 adjacent to one another, as shown exemplarily in FIGS. 2A to 2E. Usually, the respective crystallites (also referred to as grains) are separated from one another via so-called grain boundaries. Each of the crystallites has a spatial orientation associated therewith. In some aspects, the spatial orientation may be randomly distributed among the plurality of crystallites. The term random may be understood relative to the total number of crystallites, e.g., the number of different spatial orientations present in a random orientation distribution may be for example greater than 5, greater than 50, or greater than 500. In this meaning, random may be regarded as not oriented into a same direction. In the case that the number of crystallites is only two, for example, a random orientation may be understood that the two crystallites are oriented into substantially different directions in space (e.g., into opposite directions or the directions may deviate from one another by an angle of at least 45°).

The spatial orientation may be randomly distributed (or at least not completely textured) with respect to the height direction (for example an out-of-plane direction), with respect to a lateral direction (in-plane direction) that is substantially perpendicular to the height direction, and/or with respect to a reference direction that is perpendicular to a surface of the first electrode 110 facing the memristive element 130 and/or perpendicular to a surface of the second electrode 120 facing the memristive element 130. The spatial orientation may have an influence on a main polarization direction (indicated by the arrows in FIG. 6 and FIG. 7, for example) of the crystallites, since the polarization properties of a crystallite are linked to the crystal structure of the crystallite.

According to various aspects, it was found that the microstructure of a memristive material can be controlled during and/or after growth of the memristive material that forms the memristive element 130 of a memristive structure 100. FIG. 2A to FIG. 2E show exemplary scanning electron microscopy images of memristive material (e.g., that can be used to from a memristive structure 100) in a top view, according to various aspects. The crystallinity of the material (e.g., the individual grains) that forms the memristive element 130 can be clearly seen in the scanning electron microscopy image. As illustrated, the respective crystallites 230 of the memristive material differ from one another with respect to their widths and shapes. In some aspects, the height of the respective crystallites may be the same as (or less than) the thickness of the memristive element 130.

A respective width of the crystallites 230 along the lateral direction may be, for example, less than 2 μm. The average crystallite width may be, for example, less than 2 μm. The width direction may be defined parallel to a surface of the first electrode 110 facing the memristive element 130 (e.g., in the plane 103/105 defined by the directions 103, 105). The width of each of the crystallites may is defined as being a maximum dimension measured on any of the lateral directions (e.g., measured in a direction in the plane 103/105). The memristive element 130 shown in FIG. 2A has an average height of the memristive element 130 of about 555 nm. The crystallite width is distributed between 300 nm and 1200 nm. The memristive element 130 shown in FIG. 2B has an average height of the memristive element 130 of about 662 nm. The crystallite width is distributed between 300 nm and 600 nm. The memristive element 130 shown in FIG. 2C has an average height of the memristive element 130 of about 609 nm. The crystallite width is distributed between 400 nm and 900 nm. The memristive element 130 shown in FIG. 2D has an average height of the memristive element 130 of about 531 nm. The crystallite width is distributed between 350 nm and 1100 nm. The memristive element 130 shown in FIG. 2E has an average height of the memristive element 130 of about 260 nm. The crystallite width is distributed between 80 nm and 150 nm.

Various aspects are related to a memristive element 130 (e.g., an analog memristive element 130) included in a memristive structure 100 (e.g., in an analog memristive structure 100) and/or a memristive device (e.g., in an analog memristive structure device) including one or more memristive structures 100 (e.g., one or more analog memristive structures 100). A memristive structure (also referred to as a resistive switch, memristor, memristor element, or memristor structure) may be regarded as an analog memristive structure in the case that the memristive structure exhibits a continuous change in current (e.g., in the read current $I_{read}$) when linearly ramping the applied voltage in predefined ramping schemes (e.g., from 0 V to $+V_{max}$ and from $+V_{max}$ to 0 V and from 0 V to $-V_{max}$ and from $-V_{max}$ to 0 V), as illustrated, for example, in FIG. 3A and FIG. 3B.

Figure 3A:
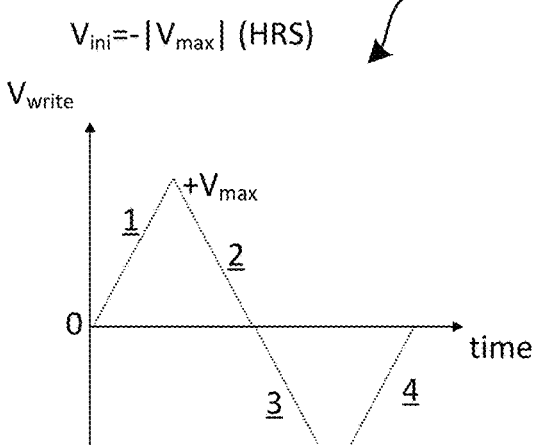
FIG. 3A through FIG. 3C show aspects of electric characteristics corresponding to barrier switching of a memristive structure.
Figure 3A:
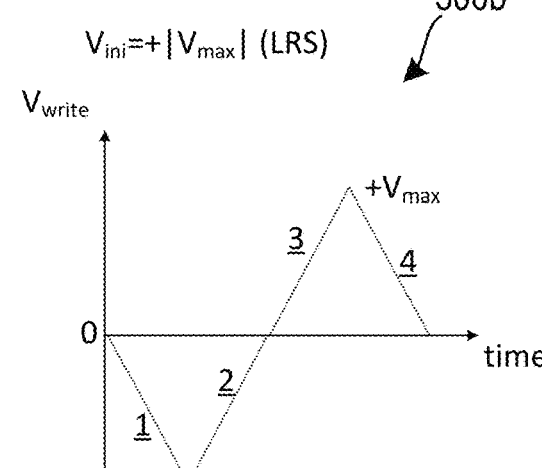
Figure 3B:
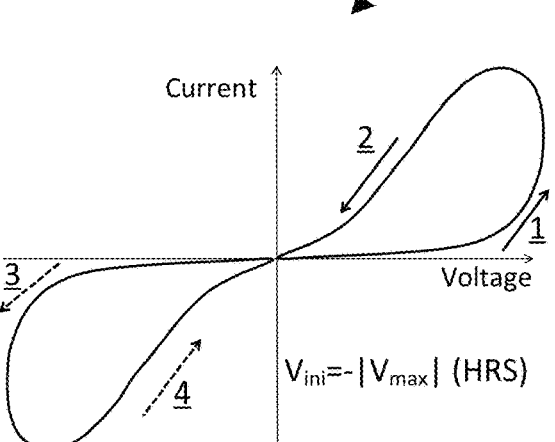
Figure 3B:
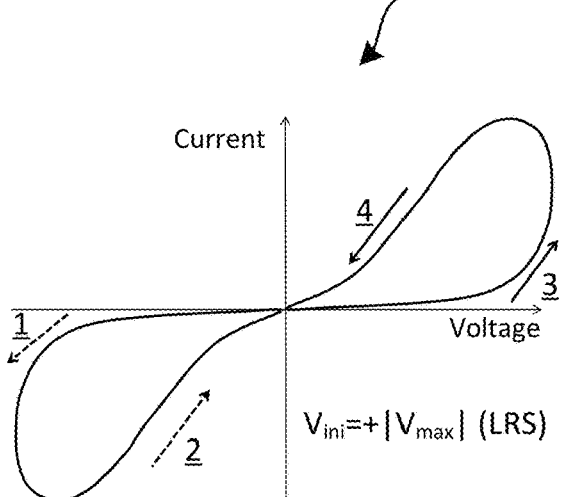
Figure 3C:
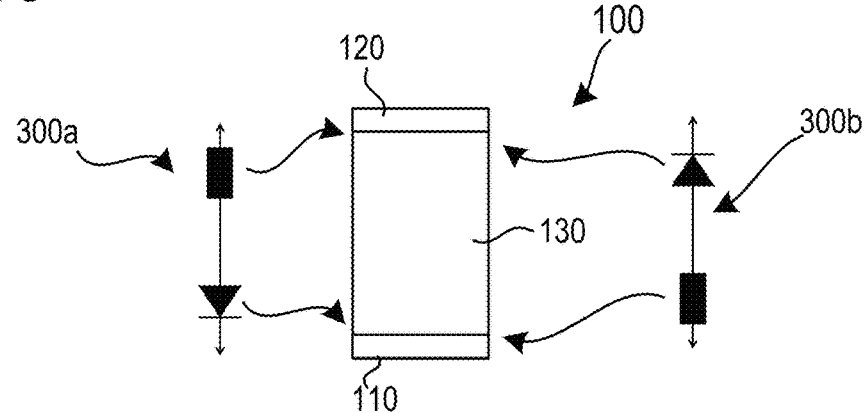

FIG. 3A shows two exemplary ramping schemes 300a, 300b that can be used to characterize electrical properties of a memristive element 130 and of a memristive structure 100, according to various aspects. FIG. 3B shows exemplary current/voltage characteristic of a memristive structure 100 obtained via the two exemplary ramping schemes 300a, 300b, according to various aspects. FIG. 3C shows a schematic of a barrier switching of a memristive element 130 and a memristive structure 100, according to various aspects.

According to various aspects, the memristive structure 100 can be brought into various different memristive states, e.g., various low resistive states (LRS) and various high resistive states (HRS). Typically, the memristive structure 100 can be set into a well-defined resistance state by applying an initialization voltage, $V_{ini}$, and subsequently applying a desired write voltage that defines the respective resistance state in which the memristive structure 100 is residing in after the write voltage has been applied. The resistance state can be determined by applying a read voltage that is lower than the write voltage and analyzing a resulting read current. However, the resulting read current can be disturbed by ferroelectric switching effects that may produce an additional current contribution (e.g., due to a change in the polarization charge stored in the memristive element 130 due to its ferroelectric properties). Therefore, various aspects are related to reduce and/or avoid current contributions from ferroelectric switching at least in the read/write voltage range that is used to operate the memristive structure 100 based on its intended barrier switching.

According to various aspects, electric properties of a memristive element 130 may be changed and/or analyzed by applying a write voltage $V_{write}$. The write voltage may be varied between $-|V_{max}|$ to $+|V_{max}|$ via, for example, a predefined ramp scheme for negative (HRS) initializations 300a and a positive (HRS) initializations 300b as shown in FIG. 3A. Typically, the resistance state may be identified (measured) by applying a read voltage. In some aspects, the read voltage may not change the resistance state of the memristive structure 100. After an initialization operation (e.g., including applying the initialization voltage, $V_{ini}$, to the electrodes of the memristive structure 100), the respective write voltage, $V_{write}$, is applied, and the resistance state is read out with the read voltage to obtain the current/voltage characteristics as shown herein in various figures. Before applying a next write voltage, a next initialization voltage is applied, and, subsequently, the next resistance state can be read out with the read voltage. The initialization voltage and the read voltage may be kept the same during measuring a characteristic curve including the branches 1 to 4 (see, for example, FIG. 3B). An applied voltage in the range from a positive voltage (>0 V) to a predefined positive voltage $+V_{max}$ may be used as a positive write voltage and an applied voltage in the range from a negative voltage (<0 V) to a predefined negative voltage $-V_{max}$ may be used as a negative write voltage.

In some aspects, an analog memristive structure 100 with dominating barrier switching may be operated by a read voltage that is outside the write voltage range. Otherwise the barrier height would be changed and the memristive structure 100 would be written into another resistance state upon applying the read voltage. The barrier switching, as explained in more detail below, may enable to read out additional information via a polarity of the read voltage. FIG. 3B illustrates current/voltage characteristics of a memristive structure 100 that shows solely a barrier switching. The barrier switching (also referred to as memristive switching) may be understood as illustrated in FIG. 3C.

FIG. 3C shows two equivalent circuits representing the electrical condition of a memristive structure for a first (HRS) initialization (300a) and a second (LRS) initialization (300b), according to various aspects. The memristive structure 100 may be in a self-rectifying configuration. The self-rectifying configuration and/or the desired switching behavior may be caused by a formation of a diode (e.g., a Schottky contact) and a resistor at the interfaces between the first electrode 110 and the memristive element 130 and between the second electrode 120 and the memristive element 130 (the memristive element 130 may be a memristive material portion). The diode and the resistor are coupled to one another in a series connection and provide the described HRS and LRS states for a defined polarity. The switching of the memristive structure 100 and therefore the presence of a diode-contact or a resistive contact at the respective electrode regions may be defined by the memristive material, e.g., by presence and/or absence of oxygen vacancies in the electrode regions.

Illustratively, the first equivalent circuit 300a may correspond to a negative initialization, e.g., with $V_{ini}=-|V_{max}|$, wherein the LRS state may be related to $V_{read}=-|V_{read}|$ (see branch 3 of the I/V characteristics described herein) and the HRS state may be related to $V_{read}=+|V_{read}|$ (see branch 4 of the I/V characteristics described herein). The second equivalent circuit 300b may correspond to a positive initialization, e.g., with $V_{ini}=+|V_{max}|$, wherein the LRS state may be related to $V_{read}=+|V_{read}|$ (see branch 1 of the I/V characteristics described herein) and the HRS state may be related to $V_{read}=-|V_{read}|$ (see branch 2 of the I/V characteristics described herein).

Figures 4A, 4B, 4C:
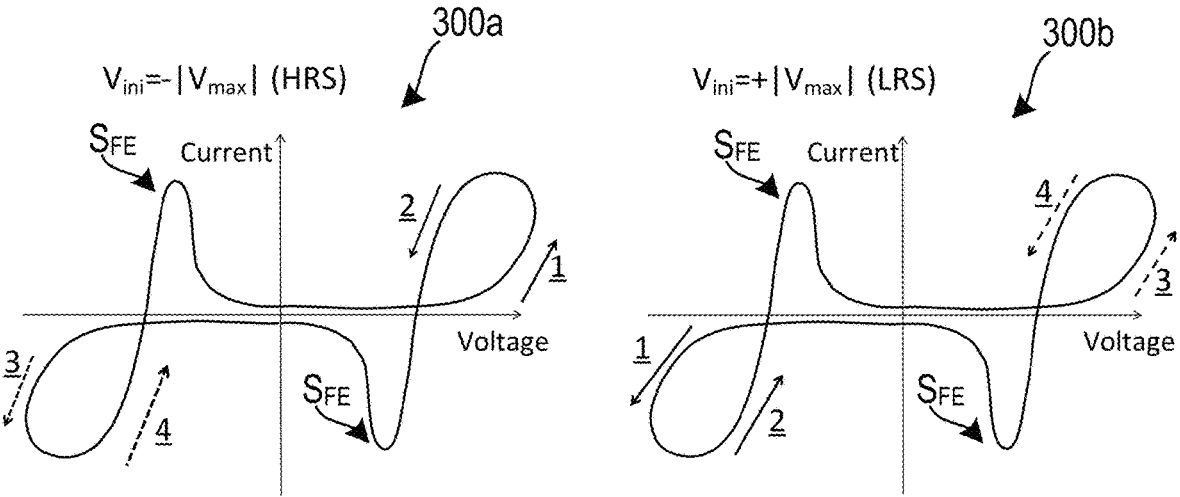
FIG. 4A through FIG. 4C show aspects of electric characteristics corresponding to barrier switching of a memristive element with a superimposed ferroelectric switching of the memristive element.

According to various aspects, in the case that the analog memristive structure 100 shows a substantial ferroelectric switching, the read voltage may be selected to be less than a polarization switching voltage at which a polarization current is caused (see FIG. 4). In contrast to an analog memristive structure 100 with dominating barrier switching (see FIG. 3B), in an analog memristive structure 100 with a substantial ferroelectric switching no additional information can be acquired from the polarity of the read voltage. A use of an analog memristive structure 100 with dominating barrier switching may demand suppressing the ferroelectric switching, as explained herein according to various aspects. The barrier switching may dominate when a ferroelectric polarization current is smaller than a barrier switching current and/or when the voltage where a polarization current flows is in the read voltage range of the memristor. In some aspects, the ferroelectric switching can be dominating in branch 4 (FIG. 4A) if the barrier switching in branch 4 (FIG. 4B) is weak and in the same time the ferroelectric switching can be suppressed in branch 2 (FIG. 4A) if the barrier switching in branch 2 (FIG. 4B) is strong. Furthermore, the ferroelectric switching can be suppressed in branch 4 (FIG. 4A) if the barrier switching in branch 4 (FIG. 4B) is strong and in the same time the ferroelectric switching can be dominating in branch 2 (FIG. 4A) if the barrier switching in branch 2 (FIG. 4B) is weak.

The IV-characteristics (current-voltage-characteristics) that show whether or not a ferroelectric switching is present or absent (e.g., suppressed) can be obtained by applying a ramp voltage as shown in FIG. 3A, e.g., a ramp voltage of 0 V to $+|V_{max}|$ (part 1), $+|V_{max}|$ to 0 V (part 2), 0 V to $-|V_{max}|$ (part 3), and $-|V_{max}|$ to 0 V (part 4).

FIG. 4A illustrates IV-characteristic of a memristive element 130 and a memristive structure 100 that shows a substantial ferroelectric switching $S_{FE}$ that contributes to the measured currents. FIG. 4B and FIG. 4C illustrate the contributions to the measured currents caused by the barrier switching (compare FIG. 3B) and by the ferroelectric switching $S_{FE}$. The polarization of the memristive element 130 is changed (e.g., switched) as a function of the electric field and therefore as a function of the voltage applied to the electrodes 110, 120 of the memristive structure 100. FIG. 4C shows the current (see grey dotted line) caused by the ferroelectric switching (see the polarization curve black line) during the ramp voltage in accordance with, for example, FIG. 3A is applied. The barrier switching may be seen at the transition of part 1 to 2 and of part 3 to 4 (i.e., at $+|V_{max}|$ and/or $-|V_{max}|$) causing a typical memristive hysteresis (cf., FIG. 3B). The current contribution due to the ferroelectric switching may be visible as additional maxima and minima in the IV-characteristic curves. Comparing FIG. 4A and FIG. 4B with one another it becomes visible that the IV-characteristic of a memristive element 130 that shows ferroelectric switching represents a superposition of a current/voltage behavior caused by ferroelectric switching (see the grey dotted curve in FIG. 4B) and the desired memristive (barrier) switching (see the black curve in FIG. 4B). These finding allow for actions to compensate, avoid, and/or correct such ferroelectric switching contributions. As described herein, the microstructure of the material that provides the memristive element 130 is adapted such that a ferroelectric switching has less or no influence on the IV-characteristic and/or on the operation of the memristive structure 100. One aspect may include decreasing or increasing the coercive field and/or the switching voltage associated with the ferroelectric material of the memristive element 130 (e.g., such that the ferroelectric switching is outside the operation voltage window used to operate the memristive structure 100). One aspects may include decreasing the remanent polarization and/or the polarization charge associated with the ferroelectric material of the memristive element 130 such that the current caused by the ferroelectric switching is substantially lower than the involved currents associated with the barrier switching. In some aspects, the ferroelectric switching can be dominating in branch 4 (FIG. 4A) if the barrier switching in branch 4 (FIG. 4B) is weak and in the same time the ferroelectric switching can be suppressed in branch 2 (FIG. 4A) if the barrier switching in branch 2 (FIG. 4B) is strong. Furthermore, the ferroelectric switching can be suppressed in branch 4 (FIG. 4A) if the barrier switching in branch 4 (FIG. 4B) is strong and in the same time the ferroelectric switching can be dominating in branch 2 (FIG. 4A) if the barrier switching in branch 2 (FIG. 4B) is weak.

According to various aspects, the memristive element 130 may include one or more portions with ferroelectric properties and one or more portions with paraelectric properties. A volume ratio of the one or more ferroelectric portions and the one or more paraelectric portions may define whether a ferroelectric switching or a barrier switching is dominant in the memristive element 130. Manufacturing parameters can be tuned to allow for a fabrication of a memristive element 130 with dominant barrier switching. Possible materials that can be used to form the memristive element 130 may be, for example, a ternary oxide, a quaternary oxide, and/or a quinary oxide. Examples for ternary oxides are perovskite oxides with a base structure $ABO_3$ or bixbyite with a base structure of $A_2O_3$ or $B_2O_3$ or mixtures thereof. Further, mixtures may include different impurities at the A or B site. Examples of elements for A may include $La^{3+}$, Ce, Nd, Sm, Eu, Gd, Tb, Dy, Ho, Er, Yp, Lu, Ca, Pr, Pm, Tm, Tl, Pb, Bi, Sr, Y, Ba, Cr, Pu (e.g., all $^{3+}$ like $La^{3+}$). Examples of elements for B may include $Al^{3+}$, Cr, Fe, Ga, In, Sc, V, Ti, Mn, Co, Ni, Sn (e.g., all $^{3+}$ like $Al^{3+}$). Examples of impurities at the A site may include Ca, La, Ce, Nd, Sm, Eu, Gd, Tb, Dy, Ho, Er, Yb, Lu, Pr, Pm, Tm, Tl, Pb, Bi, Sr, Y, La, Ba, Cr Pu, Al, Cr, Fe, Ga, In, Sc, V, Ti, Mn, Co, Ni, Sn, e.g., with a different valence than $^{3+}$. Examples of impurities at the B site may include Al, Cr, Fe, Ga, In, Sc, V, Ti, Mn, Co, Ni, Sn, Ca, La, Ce, Nd, Sm, Eu, Gd, Tb, Dy, Ho, Er, Yb, Lu, Pr, Pm, Tm, Tl, Pb, Bi, Sr, Y, La, Ba, Cr, Pu, e.g., with a different valence than $^{3+}$. Perovskite oxides may be present in different phases like for example a rhombohedral alpha phase, an orthorhombic beta phase, a hexagonal phase, and/or a cubic bixbyite phase. Perovskite oxides may be ferroelectric in the rhombohedral alpha phase and paraelectric in the other phases. The volume share of the paraelectric phases may be increased by adapting one or more manufacturing parameters. Examples of suitable crystalline materials may include the ternary oxides $CaTiO_3$, $BaTiO_3$, $PbTiO_3$, $LaNiO_3$, $NdAlO_3$, and/or $PrAlO_3$.

Figure 5A:
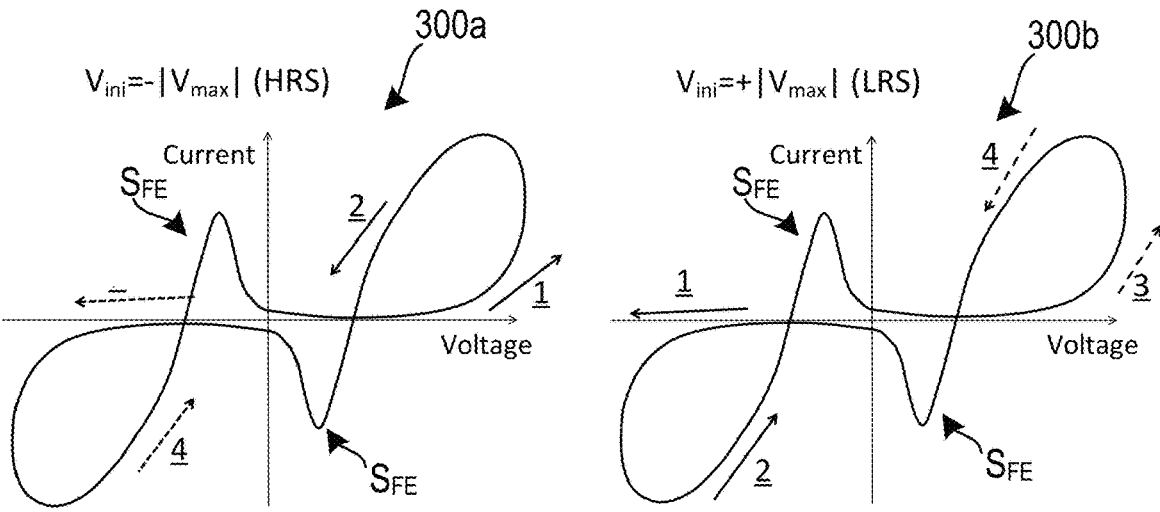
FIG. 5A through FIG. 5C show aspects of electric characteristics corresponding to barrier switching of a memristive element with a superimposed ferroelectric switching of the memristive element.
Figure 5B:
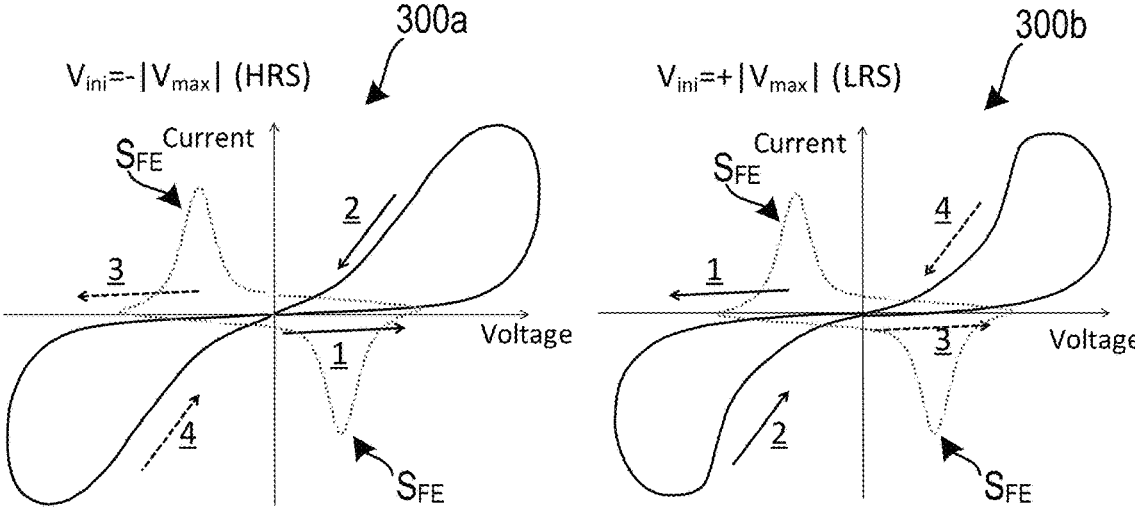
Figure 5C:
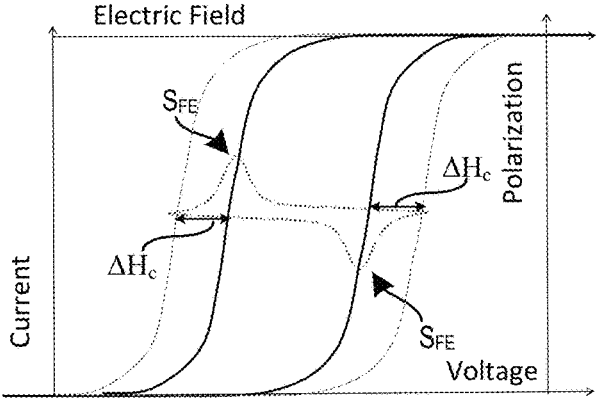

FIG. 5A, FIG. 5B, and FIG. 5C illustrate various current contributions caused by ferroelectric switching, $S_{FE}$, similar as in FIGS. 4A to 4C, but with a reduced coercive field ($\Delta H_c$). A reduced coercive field has the result that the ferroelectric material switches at lower electric fields and therefore at lower voltages compared to the higher coercive field. This may allow to avoid influences of the ferroelectric switching on the operation of the memristive structure 100, e.g., in the case that the coercive field is small enough such that the corresponding switching voltage is outside (e.g., smaller or larger than) the operation voltage range (e.g., outside the read and write voltage range).

As an example, a memristive structure 100 having the IV-characteristics shown in FIGS. 5A to 5C may allow or a more reliable memristive operation compared to a memristive structure having the IV-characteristics shown in FIGS. 4A to 4C.

Figure 6A:
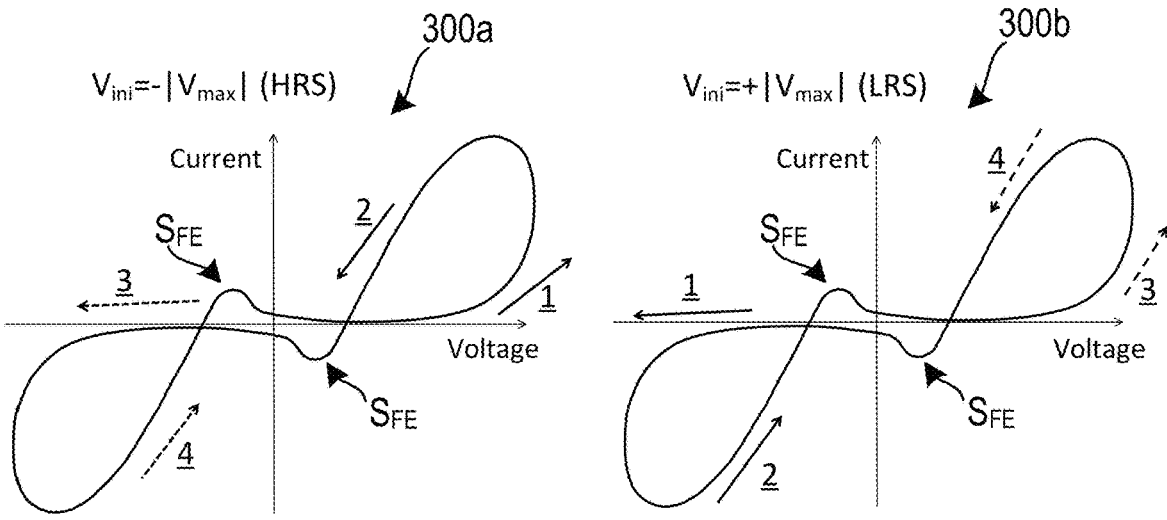
FIG. 6A through FIG. 6C show aspects of electric characteristics corresponding to barrier switching of a memristive element with a superimposed ferroelectric switching of the memristive element.
Figure 6B:
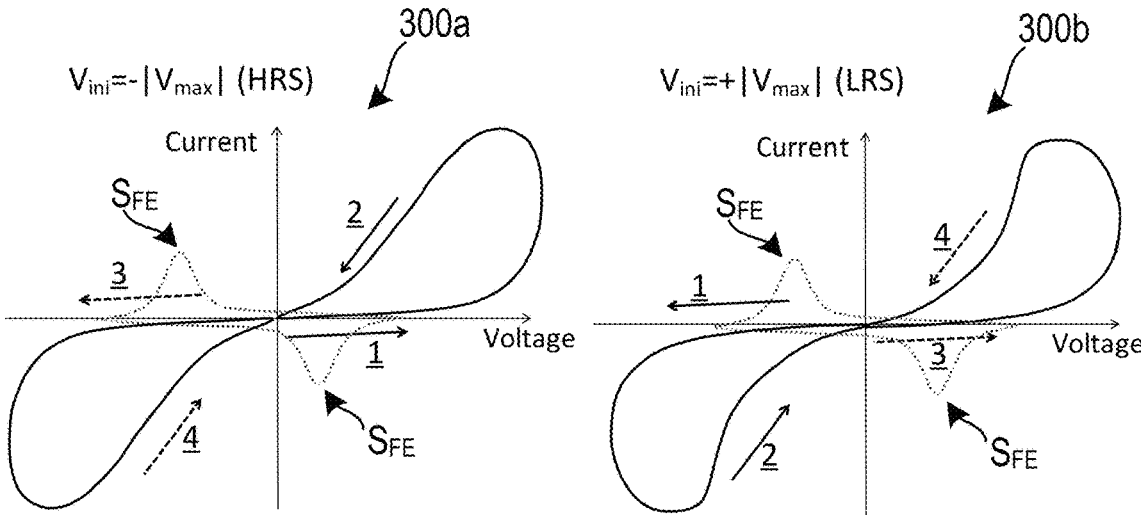
Figure 6C:
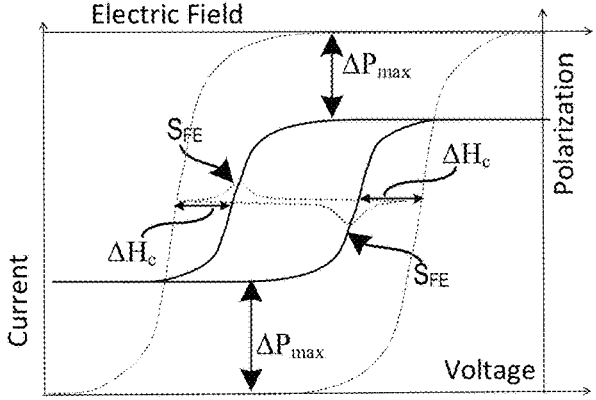

FIG. 6A, FIG. 6B, and FIG. 6C illustrate various current contributions caused by ferroelectric switching, $S_{FE}$, similar as in FIGS. 4A to 4C and FIGS. 5A to 5C, but with a reduced coercive field ($\Delta H_c$) and a reduced remanent polarization ($\Delta P_{max}$). A reduced coercive field has the result that the ferroelectric material switches at lower electric fields and therefore at lower voltages compared to the higher coercive field and a reduced remanent polarization has the result that the ferroelectric switching current is lower compared to the higher remanent polarization. This may allow to avoid more efficiently influences of the ferroelectric switching on the operation of the memristive structure 100, e.g., in the case that the coercive field is small enough such that the corresponding switching voltage is outside (e.g., smaller or larger than) the operation voltage range (e.g., outside the read and write voltage range) and in the case that the remanent polarization is small enough such that the corresponding switching current has no or only a negliable influence on the operation of the memristive structure.

As an example, a memristive structure 100 having the IV-characteristics shown in FIGS. 6A to 6C may allow or a more reliable memristive operation compared to a memristive structure having the IV-characteristics shown in FIGS. 4A to 4C.

Figure 7A:
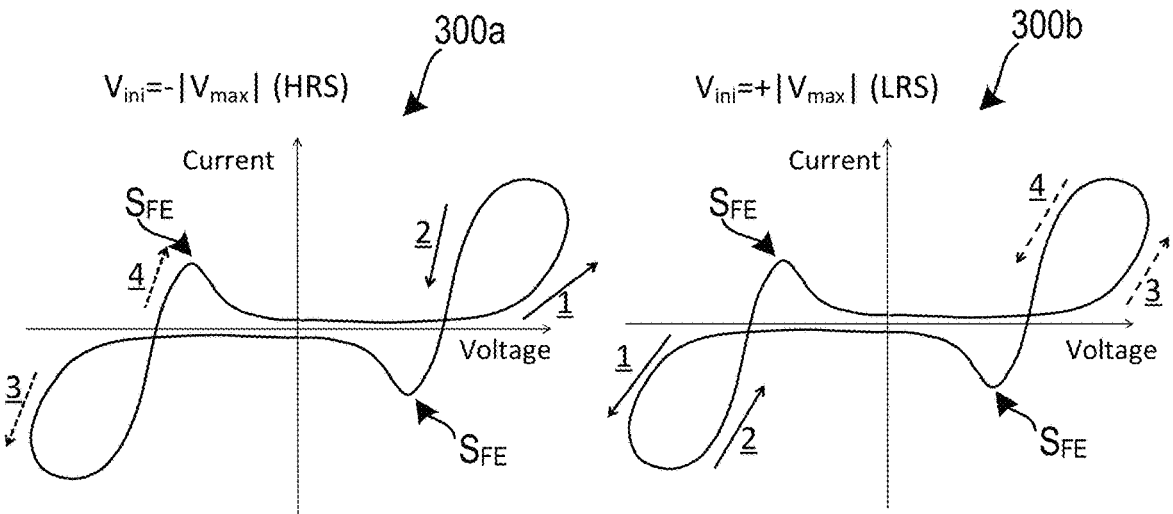
FIG. 7A through FIG. 7C show aspects of electric characteristics corresponding to barrier switching of a memristive element with a superimposed ferroelectric switching of the memristive element.
Figure 7B:
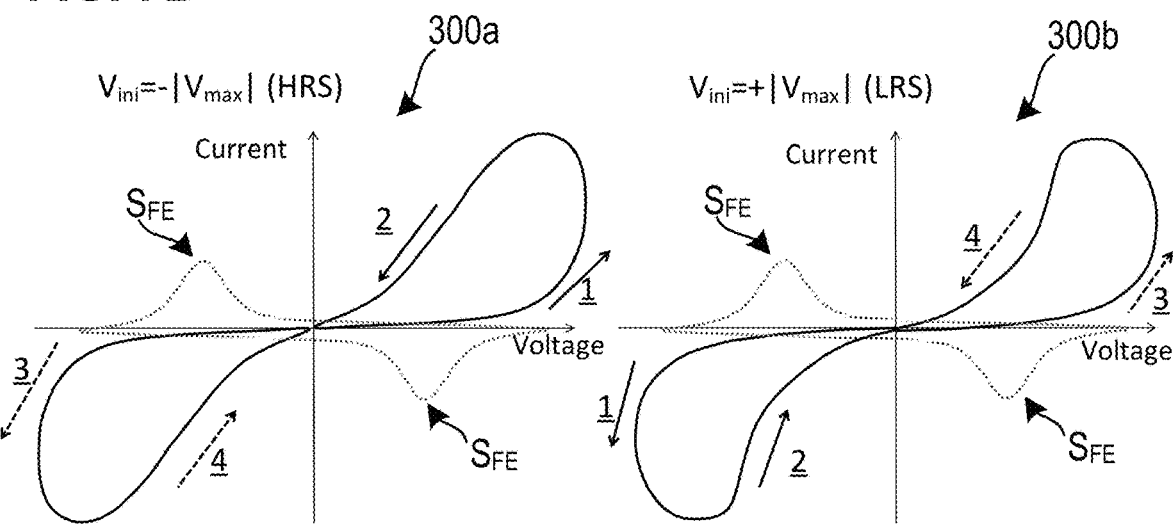
Figure 7C:
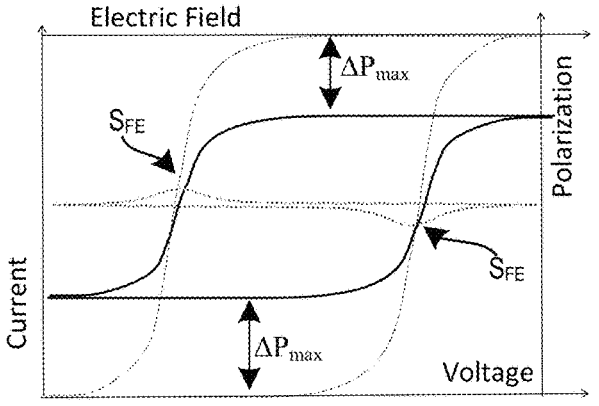
Figure 8A:
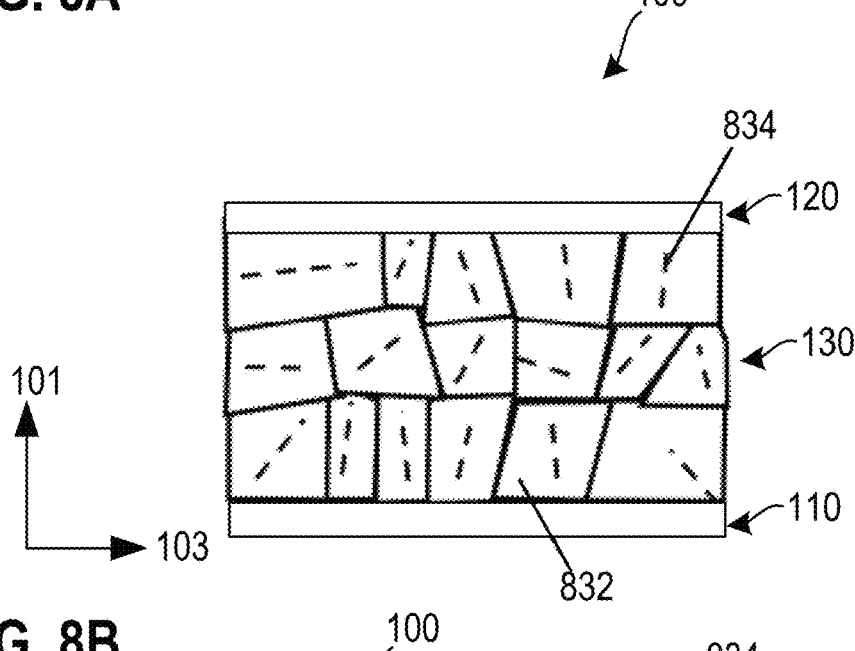
FIG. 8A through FIG. 8E schematically show various aspects of a memristive structure.
Figure 8B:
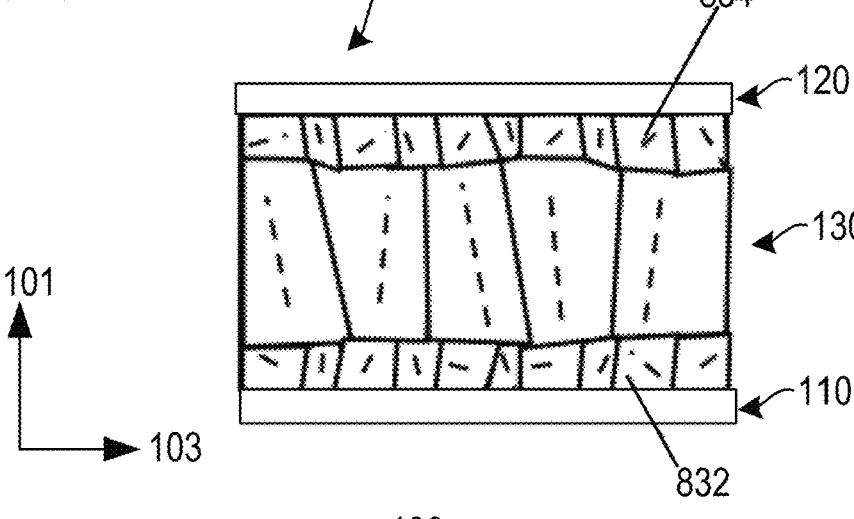
Figure 8C:
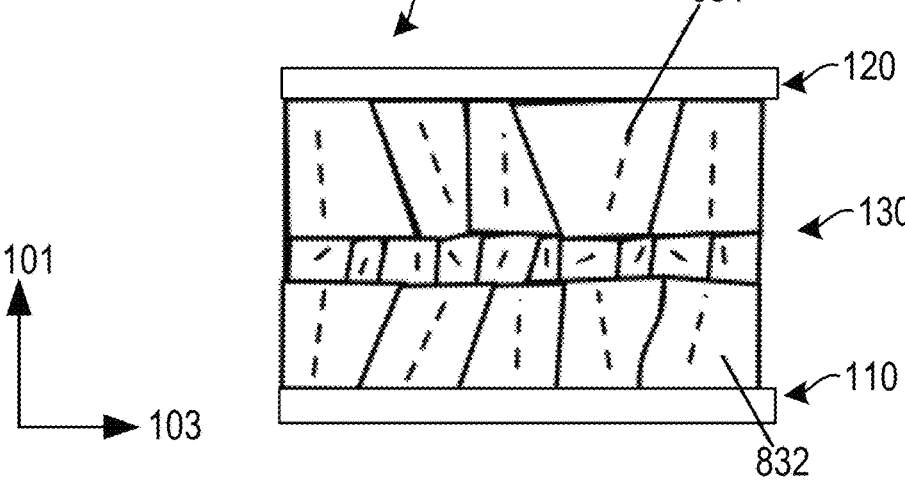
Figure 8D:
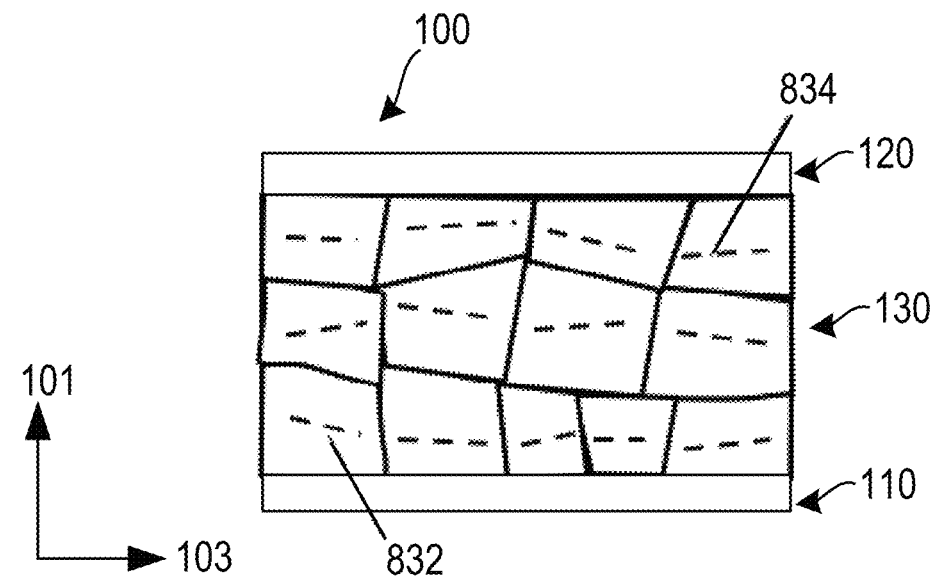
Figure 8E:
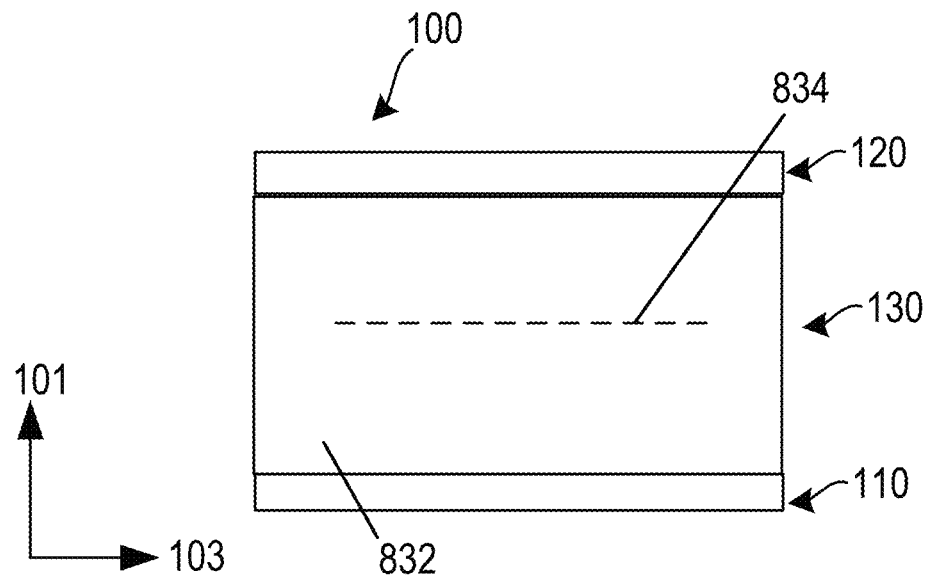

FIG. 7A, FIG. 7B, and FIG. 7C illustrate various current contributions caused by ferroelectric switching, $S_{FE}$, similar as in FIGS. 4A to 4C, FIGS. 5A to 5C, and FIGS. 6A to 6C, a reduced remanent polarization ($\Delta P_{max}$). A reduced remanent polarization has the result that the ferroelectric switching current is lower compared to the higher remanent polarization. This may allow to avoid influences of the ferroelectric switching on the operation of the memristive structure 100, e.g., in the case that the remanent polarization is small enough such that the corresponding switching current has no or only a negligible influence on the operation of the memristive structure.

As an example, a memristive structure 100 having the IV-characteristics shown in FIGS. 7A to 7C may allow or a more reliable memristive operation compared to a memristive structure having the IV-characteristics shown in FIGS. 4A to 4C.

According to various aspects, as described herein, various microstructural properties of one or more materials that form the memristive element 130 of a memristive structure 100 can be controlled during fabrication, e.g., by adapting deposition energy, deposition pressure, deposition temperature, annealing budgets, only as examples. Furthermore, the influences of ferroelectric material on the electric properties of the memristive element 130 and therefore of the memristive structure 100 are described herein. In the following, various aspects are described that are related to a desired microstructure of the one or more materials that form the memristive element 130 to achieve enhanced electric properties for the memristive element 130 including or consisting of such one or more materials with an adapted microstructure.

FIG. 8A, FIG. 8B, FIG. 8C, FIG. 8D, and FIG. 8E show various aspects of the memristive element 130 of a memristive structure 100. The microstructure (e.g., the crystallinity) of the material the forms the memristive element 130 may influence the ferroelectric properties and therefore the electric properties of the memristive structure 100. According to various aspects, the memristive element 130 may include (e.g., may consist of) one or more polycrystalline materials. The crystallites 832 may have an orientation direction and, in the case that the crystallites 832 show ferroelectric properties, the crystallites 832 have a main polarization direction 834 that us usually associated with the crystal structure and therefore associated with the orientation of the crystallites 832.

It was found that the smaller the crystallites 832 of a ferroelectric material the lower the coercive field. As explained above, a lower coercive field may be desirable for the memristive element 130 to suppress ferroelectric switching effects. Therefore, the memristive element 130 may include a polycrystalline material that has generally a smaller crystallite size comparted to a single crystal with the same volume. For different size of the crystallites 834 close to the top electrode 120 and of crystallites 832 close to the bottom electrode 110, the ferroelectric switching can be dominating in branch 4 (FIG. 4A) if the ferroelectric switching in branch 4 (FIG. 4B) is strong in comparison to barrier switching in branch 4 and in the same time the ferroelectric switching can be suppressed in branch 2 (FIG. 4A) if the ferroelectric switching in branch 2 (FIG. 4B) is weak in comparison to the barrier switching in branch 2. For different size of the crystallites 834 close to the top electrode 120 and of crystallites 832 close to the bottom electrode 110, the ferroelectric switching can be suppressed in branch 4 (FIG. 4A) if the ferroelectric switching in branch 4 (FIG. 4B) is weak in comparison to barrier switching in branch 4 and in the same time the ferroelectric switching can be dominating in branch 2 (FIG. 4A) if the ferroelectric switching in branch 2 (FIG. 4B) is strong in comparison to the barrier switching in branch 2.

It was found that the crystallites 832 of a ferroelectric material cause a lower remanent polarization and/or have a very high coercive field in the case that the main polarization direction 834 of the crystallites 832 are oriented perpendicular to the electric field that would cause the ferroelectric switching of the crystallites 832. Therefore, the more the crystallites 832 are oriented with their polarization direction 834 perpendicular to direction 101 (e.g., parallel to directions 103 and 105 (see FIG. 1B), the more the ferroelectric switching effects are suppressed. As explained above, a lower remanent polarization may be desirable for the memristive element 130 to suppress ferroelectric switching effects. Furthermore, in the case that the coercive field is high enough (such that the operation voltages of the memristive structure 100 do no cause a ferroelectric switching at all) the memristive structure 100 may show nearly ideal properties as, for example, shown in FIG. 3B. Therefore, the memristive element 130 may include a single or polycrystalline material that has a main polarization direction that is perpendicular to the electric field that is caused by applying a voltage between the first electrode 110 and the second electrode 120.

It was found that the greater the disorder in the spatial orientation of the crystallites 832 the lower the remanent polarization that could be caused by the crystallites 832 if the crystallites show a ferroelectric behavior. It was found that the lower the amount of crystallites 832 that is oriented with their main polarization direction 834 parallel to the electric field that is used to operate the memristive structure 100 the lower the remanent polarization that could be caused by the crystallites 832 if the crystallites show a ferroelectric behavior. It was found that the smaller the size of the crystallites 832 the lower the coercive field of the crystallites 832 if the crystallites show a ferroelectric behavior.

Therefore, one possibility to assure a well-defined barrier switching may be to form the memristive element 130 of a polycrystalline material such that the memristive element 130 includes a comparatively larger number of crystallites (e.g., more than 10, more than 100, more than 1000). Another possibility to assure a well-defined barrier switching may be to form the memristive element 130 of a single crystalline material or polycrystalline material with a main polarization direction perpendicular to the electric field direction defined by the electrodes 110, 120 of the memristive structure 100. Another possibility to assure a well-defined barrier switching may be to form the memristive element 130 of a polycrystalline material with preferably a random orientation distribution of the crystallites of the polycrystalline material.

According to various aspects, the memristive element 130 may include a polycrystalline material such that a plurality of crystallites 832 (e.g., 2 or more, e.g., 10 or more, e.g., 100 or more) are disposed directly between the two electrodes 110, 120 of the memristive structure 100. In this case, a plurality of crystallites 832 (e.g., 2 or more, e.g., 10 or more, e.g., 100 or more) are in direct contact with each of the electrodes 110, 120. The plurality of crystallites 832 (e.g., 2 or more, e.g., 10 or more, e.g., 100 or more) may be distributed over a distance (e.g., in direction 103 and/or direction 105) that is equal to or less than the width of the first electrode 110 and/or the width of the second electrode (measured along the same direction). The plurality of crystallites 832 (e.g., 2 or more, e.g., 10 or more, e.g., 100 or more) may be distributed over a distance (e.g., in direction 101) that is equal to or less than the height of the memristive element 130 (measured along the same direction).

According to various aspects, the memristive element 130 may include a mono-crystalline (single crystalline) material such that a only single crystallite 832 is disposed directly between the two electrodes 110, 120 of the memristive structure 100. In this case, only one crystallite 832 is in direct contact with each of the electrodes 110, 120. The single crystallite 832 may have a dimension (e.g., in direction 103 and/or direction 105) that is equal to or greater than the width of the first electrode 110 and/or the width of the second electrode (measured along the same direction). The single crystallite 832 may have a dimension (e.g., in direction 101) that is equal to or greater than the height of the memristive element 130 (measured along the same direction).

Figure 9:
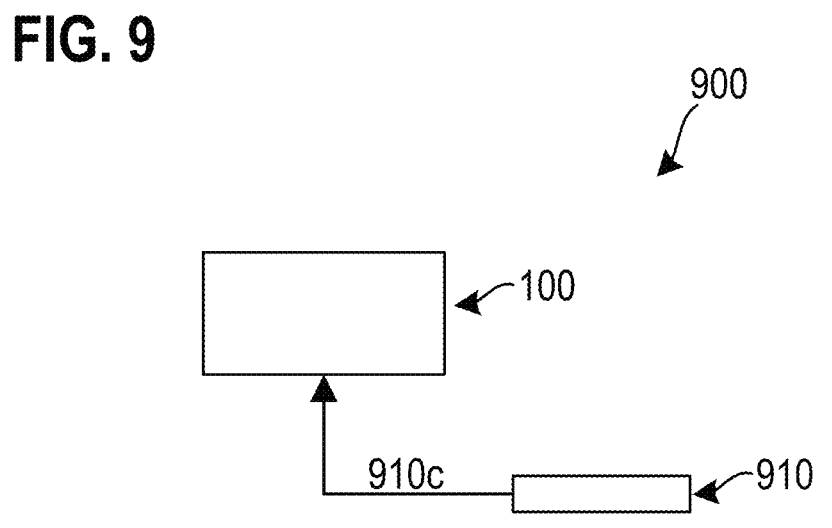

FIG. 9 illustrates memristive device 900 in a schematic view, according to various aspects. The memristive device 900 may include one or more memristive structures 100. The memristive device 900 may further include a control circuit 910 configured to control 910c (e.g., via applying two control signals to the at least two electrodes 110, 120 of the respective memristive structure 100). The control circuit 910 may be configured to cause a read operation to read a resistance of the memristive element 130 of the respective memristive structure 100. The control circuit may be configured to read out the memristive element 130 via a read voltage in a read voltage range. The control circuit 910 may be configured to cause a write operation to change a resistance of the memristive element 130 of the respective memristive structure 100. The control circuit may be configured to write the memristive element 130 via a write voltage in a write voltage range.

It is noted that the IV-characteristics shown in FIGS. 3B, 4A, 4B, 5A, 5B, 6A, 6B, 7A, and 7B show curves that are symmetric (point-symmetric) for positive and negative voltages. However, it may be sufficient to operate the memristive structure 100 in the case that a single hysteresis behavior is present in the negative voltage range, on the positive voltage range, or in both the negative and the positive voltage range, as shown in FIG. 10A to FIG. 10D exemplarily for a memristive element 130 that shows a comparatively low coercive field and a comparatively low remanent polarization (cf., FIG. 6A).

Various aspects are related to the fabrication of analog memristive elements with a ferroelectric polarization current that is smaller than a barrier switching current associated with a memristive function of the memristive element (e.g., memristive element 130 described herein). The analog memristive element may include a crystalline material from the material class of rhombohedral oxides with two electrically conductive electrodes. A maximum polarization current may be less than or equal to a maximum write voltage current. The voltage at which the ferroelectric polarization current flows can be in the read voltage range, in the write voltage range or above the write voltage range and is preferably in the read voltage range of the analog memristive element.

The use of an analog memristive element with dominant barrier switching may in some aspects benefit from a suppressed ferroelectric switching. An analog memristive element with dominant ferroelectric switching may show a continuous change in current when linearly ramping the write voltage as explained above. However, a possible ferroelectric polarization current that may be present may be less than the barrier switching current and the voltage at which the ferroelectric polarization current may flow may be within outside the write voltage range and/or outside the read voltage range of the analog memristive element.

The memristive element 130, according to various aspects may include a ferroelectric switching that is suppressed and, when the write voltage ramps in accordance with a ramping scheme (see, according to various aspects FIG. 3A), the ferroelectric polarization current is less than the barrier switching current (see, according to various aspects FIG. 5A, FIG. 6A, FIG. 7A). The analog memristive element 130 may be a crystalline $BiFeO_3$ layer. The smallest length dimension of irregularly shaped crystallites in the crystalline $BiFeO_3$ layer may be smaller than the thickness of the crystalline $BiFeO_3$ layer. The largest length dimension of the irregularly shaped crystallites may be smaller than the smallest lateral dimension of the front side electrode (see, for example, second electrode 120) and the back side electrode (see, for example, first electrode 110).

A ratio of a maximum polarization current and a maximum barrier write current and/or a ratio of a maximum polarization current charge and a maximum barrier write current charge can be defined. The ratio of the maximum polarization current charge and the maximum barrier current charge may depend on which volume fraction of the crystalline material is ferroelectric and exhibits ferroelectric switching and which volume fraction of the crystalline material is paraelectric and exhibits barrier switching.

According to various aspects, the polarization can be measured by means of P=P(E) measurements. The electric field E is determined by the ramp voltage V (E=V/d) where d is the distance between the electrode 110 and the electrode 120. During the production of a crystalline layer, the orientation and the size of the crystallites can be controlled. The more randomly the crystallites are oriented to each other, the more a possible polarization current is compensated and reduced.

In the following, various examples are provided that may include one or more aspects described above with reference to the memristive structure 100 and/or the memristive device 900.

Example 1 is a memristive structure, the memristive structure including: a first electrode, a second electrode, and a memristive element arranged between the first electrode and the second electrode; wherein the memristive element includes a memristive material that has a (e.g., inherent) ferroelectric (e.g., remanent) polarization capability, and wherein the memristive material has a crystalline microstructure configured to suppress a substantial ferroelectric switching of the memristive element in response to a voltage drop over the memristive element applied via the first electrode and the second electrode.

Example 2 is a memristive structure, the memristive structure including: a first electrode, a second electrode, and a memristive element disposed between the first electrode and the second electrode; the memristive element including a memristive material and a ferroelectric material, wherein the ferroelectric material has a crystalline microstructure configured to suppress a substantial ferroelectric switching of the memristive element in response to a voltage drop over the memristive element applied via the first electrode and the second electrode.

In Example 3, the memristive structure according to Example 1 or 2 may optionally further include that the crystalline microstructure is a poly-crystalline microstructure with an average crystallite height (e.g., measured in height direction, e.g., parallel to direction 101 shown in FIG. 1B), wherein a thickness of the memristive element is greater than twice the average crystallite height.

In Example 4, the memristive structure according to any one of Examples 1 to 3 may optionally further include that the crystalline microstructure is a poly-crystalline microstructure with a maximal crystallite height, wherein a thickness of the memristive element is the same as the maximal crystallite height.

In Example 5, the memristive structure according to any one of Examples 1 to 4 may optionally further include that the crystalline microstructure is a poly-crystalline microstructure with a maximal crystallite height, wherein a thickness of the memristive element is the substantially greater than (e.g., at least twice) the maximal crystallite height.

In Example 6, the memristive structure according to any one of Examples 1 to 5 may optionally further include that the crystalline microstructure is a poly-crystalline microstructure with an average crystallite height of less than 1000 nm.

In Example 7, the memristive structure according to any one of Examples 1 to 6 may optionally further include that the crystalline microstructure is a poly-crystalline microstructure with a maximal height of less than 1000 nm.

In Example 8, the memristive structure according to any one of Examples 1 to 7 may optionally further include that the crystalline microstructure is a poly-crystalline microstructure with a minimal crystallite height of greater than 10 nm, e.g. greater than 20 nm, e.g., greater than 50 nm, e.g., greater than 100 nm, e.g., greater than 200 nm.

In Example 9, the memristive structure according to any one of Examples 3 to 8 may optionally further include that the crystallite height (e.g., the average crystallite height, the minimal crystallite height, and/or the maximal crystallite height) may be defined perpendicular to a first surface of the first electrode, the first surface facing the memristive element, and/or perpendicular to a second surface of the second electrode, the second surface facing the memristive element.

In Example 10, the memristive structure according to any one of Examples 3 to 9 may optionally further include that the crystallite height (e.g., the average crystallite height, the minimal crystallite height, and/or the maximal crystallite height) may be defined parallel to an electric field caused by the first electrode and second electrode upon applying a voltage between the first electrode and the second electrode.

In Example 11, the memristive structure according to any one of Examples 1 to 10 may optionally further include that the crystalline microstructure is a poly-crystalline micro-structure with a plurality of crystallites, wherein a spatial orientation of the plurality of crystallites is randomly distributed.

In Example 12, the memristive structure according to any one of Examples 1 to 11 may optionally further include that the crystalline microstructure is a poly-crystalline micro-structure with a plurality of crystallites, wherein one or more crystallites of the plurality of crystallites are oriented in a first direction and wherein one or more other crystallites of the plurality of crystallites are oriented in a second direction distinct from the first direction.

In Example 13, the memristive structure according to any one of Examples 1 to 12 may optionally further include that the first direction and/or the second direction are angled (e.g., with an angle from 45 degree to 90 degree) relative to a direction of an electric field caused by the first electrode and second electrode upon applying a voltage between the first electrode and the second electrode.

In Example 14, the memristive structure according to any one of Examples 12 and/or 13 may optionally further include that the first direction and/or the second direction are substantially parallel (e.g., ±15 degree) to a first surface of the first electrode, the first surface facing the memristive element, and/or parallel to a second surface of the second electrode, the second surface facing the memristive element.

In Example 15, the memristive structure according to Example 11 may optionally further include that the spatial orientation of the plurality of crystallites is randomly distributed with respect to a height direction (out-of plane, e.g., parallel to direction 101 shown in FIG. 1B)) and/or with respect to a lateral (in-plane) direction.

In Example 16, the memristive structure according to any one of Examples 1 to 15 may optionally further include that the crystalline microstructure is a poly-crystalline micro-structure with a plurality of crystallites, wherein a spatial orientation of the plurality of crystallites is randomly distributed with respect to a reference direction.

In Example 17, the memristive structure according to Example 16 may optionally further include that the reference direction is oriented perpendicular to a surface of the first electrode facing the memristive element and/or perpendicular to a surface of the second electrode facing the memristive element.

In Example 18, the memristive structure according to any one of Examples 1 to 17 may optionally further include that the crystalline microstructure is a poly-crystalline micro-structure with a plurality of crystallites, wherein the plurality of crystallites has a spatial orientation distribution such that a main polarization direction of the plurality of crystallites is oriented substantially parallel to a surface of the first electrode facing the memristive element and/or substantially parallel to a surface of the second electrode facing the memristive element.

In Example 19, the memristive structure according to any one of Examples 1 to 17 may optionally further include that the crystalline microstructure is a mono-crystalline micro-structure (e.g., the memristive element 130 is provided by a single crystal of a memristive material) with a single crys-tallite, wherein the single crystallite is oriented such that a main polarization direction of the single crystallite is oriented substantially parallel to a surface of the first electrode facing the memristive element and/or substantially parallel to a surface of the second electrode facing the memristive element.

In Example 20, the memristive structure according to any one of Examples 18 and/or 19 may optionally further include that a substantially parallel orientation includes a maximal deviation from a parallel orientation of less than 15°.

In Example 21, the memristive structure according to any one of Examples 1 to 18 and/or 20 may optionally further include that the crystalline microstructure is a poly-crystal-line microstructure with an average crystallite width (along a lateral direction, e.g., along direction 103 and/or 105, e.g., perpendicular to direction 101 shown in FIG. 1B) of less than 2 µm.

In Example 22, the memristive structure according to any one of Examples 1 to 18, 20 and/or 21 may optionally further include that the crystalline microstructure is a poly-crystal-line microstructure with a maximal crystallite width (along a lateral direction, e.g., along direction 103 and/or 105, e.g., perpendicular to direction 101 shown in FIG. 1B) of less than 2 µm.

In Example 23, the memristive structure according to any one of Examples 1 to 18 and/or 20 to 22 may optionally further include that the crystalline microstructure is a poly-crystalline microstructure with a minimal crystallite width (along a lateral direction, e.g., along direction 103 and/or 105, e.g., perpendicular to direction 101 shown in FIG. 1B) of greater than nm.

In Example 24, the memristive structure according to any one of Examples 22 and/or 23 may optionally further include that the crystallite width (e.g., the average crystallite width, the minimal crystallite width, and/or the maximal crystallite width) is defined parallel to a surface of the first electrode facing the memristive element and/or parallel to a surface of the second electrode facing the memristive element.

In Example 25, the memristive structure according to any one of Examples 21 to 24 may optionally further include that the crystallite width (e.g., the average crystallite width, the minimal crystallite width, and/or the maximal crystallite width) is defined perpendicular to an electric field caused by the first electrode and second electrode upon applying a voltage between the first electrode and the second electrode.

In Example 26, the memristive structure according to any one of Examples 1 to 18 and/or 20 to 25 may optionally further include that the crystalline microstructure is a poly-crystalline microstructure with a first type of crystals and a second type of crystals, wherein the first type of crystals has an average crystallite size different from an average crys-tallite size of the second type of crystals.

In Example 27, the memristive structure according to Example 26 may optionally further include that the average crystallite size includes an average crystallite height and/or an average crystallite width.

In Example 28, the memristive structure according to Examples 1 or 2 may optionally further include that the crystalline microstructure is a single-crystalline microstruc-ture, wherein a main polarization direction of a single crystal thereof is oriented substantially parallel to a surface of the first electrode facing the memristive element and/or sub-stantially parallel to a surface of the second electrode facing the memristive element.

In Example 29, the memristive structure according to any one of Examples 1 to 28 may optionally further include that a coercive voltage associated with a polarization switching of the memristive element is outside a write voltage range associated with a memristive switching of the memristive element.

In Example 30, the memristive structure according to any one of Examples 1 to 29 may optionally further include that the basic memristive material includes an oxide material, the oxide material including at least one of bismuth, iron, hafnium, strontium, and/or titanium.

In Example 31, the memristive structure according to any one of Examples 1 to 31 may optionally further include that the memristive structure is configured as a self-rectifying memristive structure; and/or that the memristive structure is configured to exhibit a nonlinear switching behavior.

In Example 32, the memristive structure according to any one of Examples 1 to 31 may optionally further include that the memristive material of the memristive element is configured to allow for a control of a Schottky-barrier height caused by a contact of the memristive material with the first electrode or with the second electrode.

In Example 33, the memristive structure according to Example 32 may optionally further include that the control of a Schottky-barrier height includes: creating, increasing and/or remove, decreasing the Schottky-barrier height via an application of one or more write voltage drops over the memristive structure between the first electrode and the second electrode.

In Example 34, the memristive structure according to any one of Examples 1 to 33 may optionally further include that the memristive element is configured to allow for a control of an electric resistance of the memristive structure.

In Example 35, the memristive structure according to Example 34 may optionally further include that the control of the electric resistance memristive includes: continuously increasing the electric resistance up to a maximal electric resistance and/or continuously decreasing the electric resistance down to a minimal electric resistance.

In Example 36, the memristive structure according to Example 35 may optionally further include that the maximal electric resistance is associated with a minimal barrier current through the memristive element and wherein the minimal electric resistance is associated with a maximal barrier current through the memristive structure.

In Example 37, the memristive structure according to Example 36 may optionally further include that an actual electric resistance of the memristive structure represents an actual memristive state of the memristive structure and is associated with an actual barrier current through the memristive structure.

In Example 38, the memristive structure according to Example 37 may optionally further include that reading the electric resistance of the memristive structure may include determining the actual barrier current through the memristive structure representing the actual memristive state of the memristive structure.

Example 40 is a memristive device including a memristive structure according to any one of Examples 1 to 38 and a control circuit to operate the memristive structure.

Example 41 is a memristive device, including: a memristive structure, the memristive structure including a first electrode, a second electrode, and a memristive element disposed between the first electrode and the second electrode; wherein the memristive element includes a memristive material that has a barrier switching capability and a ferroelectric switching capability, and wherein the memristive element is configured to substantially suppress a ferroelectric switching of the memristive element in response to a voltage drop over the memristive element applied via the first electrode and the second electrode that causes a barrier switching of the memristive element.

In Example 42, the memristive device according to Example 41 may optionally further include: a control circuit to control a read operation of the memristive element, wherein the control circuit is configured to read out the memristive element via a read voltage in a read voltage range.

In Example 43, the memristive device according to Example 42 may optionally further include: a control circuit to control a write operation of the memristive element, wherein the control circuit is configured to write the memristive element via a write voltage in a write voltage range, wherein the write voltage range is distinct from the read voltage range.

In Example 44, the memristive device according to Example 42 and/or 43 may optionally further include that the memristive structure is configured such that a coercive voltage associated with the ferroelectric switching capability is outside the write voltage range; and/or that the memristive structure is configured such that a coercive voltage associated with the ferroelectric switching capability is outside the read voltage range.

In Example 45, the memristive device according to Example 42 may optionally further include that the memristive structure is configured such that a read out current characteristic associated with the read operation includes a maximal current caused be the ferroelectric switching is less than a maximal current caused by the barrier switching.

In Example 46, the memristive device according to Example 42 may optionally further include that the memristive structure is configured such that a read out current characteristic associated with the read operation includes a reference current to determine the memristive state of the memristive element and wherein a maximal current caused be the ferroelectric switching is less than the reference current.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

The invention claimed is:

1. A memristive structure, comprising:
   a first electrode;
   a second electrode; and
   a memristive element arranged between the first electrode and the second electrode, wherein the memristive element comprises a memristive material that has a ferroelectric polarization capability, and wherein the memristive material has a crystalline microstructure configured to suppress a substantial ferroelectric switching of the memristive element when memristively switching the memristive element in response to an electric switching field caused by a voltage drop over the memristive element applied via the first electrode and the second electrode;
   wherein the crystalline microstructure is a single-crystalline microstructure, wherein a main polarization direction of a single crystal thereof is oriented parallel to a surface of the first electrode facing the memristive element or to a surface of the second electrode facing the memristive element.

2. The memristive structure according to claim 1, wherein a coercive voltage associated with the substantial ferroelectric switching of the memristive element is outside a write voltage range associated with the memristive switching of the memristive element.

3. The memristive structure according to claim 1, wherein the memristive structure is configured as a self-rectifying memristive structure or is configured to exhibit a nonlinear switching behavior.

4. The memristive structure according to claim 1, wherein the memristive material of the memristive element is configured to allow for a control of a Schottky-barrier height caused by a contact of the memristive material with the first electrode or with the second electrode.

5. The memristive structure according to claim 1, wherein the memristive element is configured to allow for a control of an electric resistance of the memristive structure.

6. The memristive structure according to claim 5, wherein the control of the electric resistance memristive comprises: continuously increasing the electric resistance up to a maximal electric resistance or continuously decreasing the electric resistance down to a minimal electric resistance, wherein the maximal electric resistance is associated with a minimal barrier current through the memristive element and wherein the minimal electric resistance is associated with a maximal barrier current through the memristive structure.

7. The memristive structure according to claim 6, wherein an actual electric resistance of the memristive structure represents an actual memristive state of the memristive structure and is associated with an actual barrier current through the memristive structure.

8. A memristive device comprising:
a memristive structure comprising:
    a first electrode;
    a second electrode; and
    a memristive element arranged between the first electrode and the second electrode, wherein the memristive element comprises a memristive material that has a ferroelectric polarization capability, and wherein the memristive material has a crystalline microstructure configured to suppress a substantial ferroelectric switching of the memristive element when memristively switching the memristive element in response to an electric switching field caused by a voltage drop over the memristive element applied via the first electrode and the second electrode; and
a control circuit configured to control a read operation or a write operation of the memristive element, wherein the read operation comprises the control circuit configured to read out a memristive state of the memristive element via a read voltage in a read voltage range, wherein the write operation comprises the control circuit configured to write the memristive state of the memristive element via a write voltage in a write voltage range, wherein the write voltage range is distinct from the read voltage range.

9. The memristive structure according to claim 8, wherein the crystalline microstructure is a poly-crystalline microstructure with a plurality of crystallites disposed between the first electrode and the second electrode.

10. The memristive structure according to claim 9, wherein a maximal crystallite height of the plurality of crystallites is the same as a thickness of the memristive element, or wherein a maximal crystallite height of the plurality of crystallites is less than a thickness of the memristive element.

11. The memristive structure according to claim 8, wherein the crystalline microstructure comprises one or more crystallites having a main polarization direction that is perpendicular to the electric switching field.

12. The memristive structure according to claim 8, wherein the crystalline microstructure comprises a poly-crystalline microstructure with a plurality of crystallites, wherein a spatial orientation of the plurality of crystallites is randomly distributed with respect to the electric switching field.

13. The memristive structure according to claim 8, wherein the crystalline microstructure is a poly-crystalline microstructure with a plurality of crystallites, wherein one or more crystallites of the plurality of crystallites are oriented in a first direction and wherein one or more other crystallites of the plurality of crystallites are oriented in a second direction distinct from the first direction.

14. The memristive structure of claim 13, wherein the first direction or the second direction is relative to a direction of an electric field caused by the first electrode and second electrode upon applying a voltage between the first electrode and the second electrode, or wherein the first direction or the second direction are parallel to a first surface of the first electrode, wherein the first surface faces the memristive element, or to a second surface of the second electrode, wherein the second surface faces the memristive element.

15. The memristive structure according to claim 8, wherein the crystalline microstructure is a poly-crystalline microstructure with a plurality of crystallites, wherein the plurality of crystallites has a spatial orientation distribution such that a main polarization direction of the plurality of crystallites is oriented parallel to a first surface of the first electrode facing the memristive element/or to a second surface of the second electrode facing the memristive element.

16. The memristive structure according to claim 8, wherein the crystalline microstructure is a poly-crystalline microstructure with a first type of crystals and a second type of crystals, wherein the first type of crystals has an average crystallite size different from an average crystallite size of the second type of crystals.

17. The memristive structure according to claim 8, wherein the read operation comprises a maximal current caused by the ferroelectric switching that is less than a maximal current caused by the barrier switching, or wherein the read operation comprises a reference current to determine the memristive state of the memristive element and wherein a maximal current caused by the ferroelectric switching is less than the reference current.

18. The memristive device according to claim 8, wherein the read operation comprises a maximal current caused by the ferroelectric switching that is less than a maximal current caused by the barrier switching, or wherein the read operation comprises a reference current to 5 determine the memristive state of the memristive element and wherein a maximal current caused by the ferroelectric switching is less than the reference current.

\*  \*  \*  \*  \*